US010297338B2

(12) United States Patent
Shirakawa et al.

(10) Patent No.: US 10,297,338 B2
(45) Date of Patent: May 21, 2019

(54) MEMORY SYSTEM

(71) Applicant: Toshiba Memory Corporation, Minato-ku, Tokyo (JP)

(72) Inventors: Masanobu Shirakawa, Chigasaki Kanagawa (JP); Kenji Sakurada, Yamato Kanagawa (JP); Hitoshi Shiga, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 33 days.

(21) Appl. No.: 15/455,419

(22) Filed: Mar. 10, 2017

(65) Prior Publication Data

US 2018/0081542 A1  Mar. 22, 2018

Related U.S. Application Data

(60) Provisional application No. 62/396,936, filed on Sep. 20, 2016.

(51) Int. Cl.
*G11C 29/52* (2006.01)
*G11C 16/26* (2006.01)
*G11C 16/10* (2006.01)
*G06F 11/10* (2006.01)
*G11C 11/56* (2006.01)

(52) U.S. Cl.
CPC .......... *G11C 29/52* (2013.01); *G06F 11/1068* (2013.01); *G11C 11/5642* (2013.01); *G11C 16/10* (2013.01); *G11C 16/26* (2013.01); *G11C 11/5628* (2013.01)

(58) Field of Classification Search
CPC ..... G11C 16/0483; G11C 16/26; G11C 16/10; G11C 29/52; G11C 29/42; G11C 11/1068; G11C 11/5642; G11C 11/5628
See application file for complete search history.

(56) References Cited

U.S. PATENT DOCUMENTS

| 6,456,526 | B2* | 9/2002 | Tsujikawa | G11C 11/5621 |
|           |     |        |           | 365/185.02 |
| 9,312,016 | B2* | 4/2016 | Kim | G11C 16/26 |
| 2009/0267128 | A1 | 10/2009 | Maejima | |
| 2009/0268522 | A1 | 10/2009 | Maejima | |
| 2010/0207195 | A1 | 8/2010 | Fukuzumi et al. | |
| 2010/0214838 | A1 | 8/2010 | Hishida et al. | |

(Continued)

FOREIGN PATENT DOCUMENTS

| JP | 2012-181761 A | 9/2012 |
| JP | 2014-527254 A | 10/2014 |
| JP | 2015-133161 A | 7/2015 |

*Primary Examiner* — Shelly A Chase
(74) *Attorney, Agent, or Firm* — White & Case LLP

(57) ABSTRACT

A memory system includes: a semiconductor memory device; and a controller capable of issuing a first read instruction and a second read instruction different from the first read instruction. When receiving the first read instruction, the semiconductor memory device reads first data and second data from a memory cell array, holds the first data and the second data in the latch circuit, and outputs the first data to the controller. When receiving the second read instruction, the semiconductor memory device outputs third data based on the second data held by the latch circuit to the controller. The controller performs soft decision processing using the third data.

17 Claims, 28 Drawing Sheets

(56) References Cited

U.S. PATENT DOCUMENTS

| | | |
|---|---|---|
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2013/0051141 A1 | 2/2013 | Moschiano et al. |

* cited by examiner

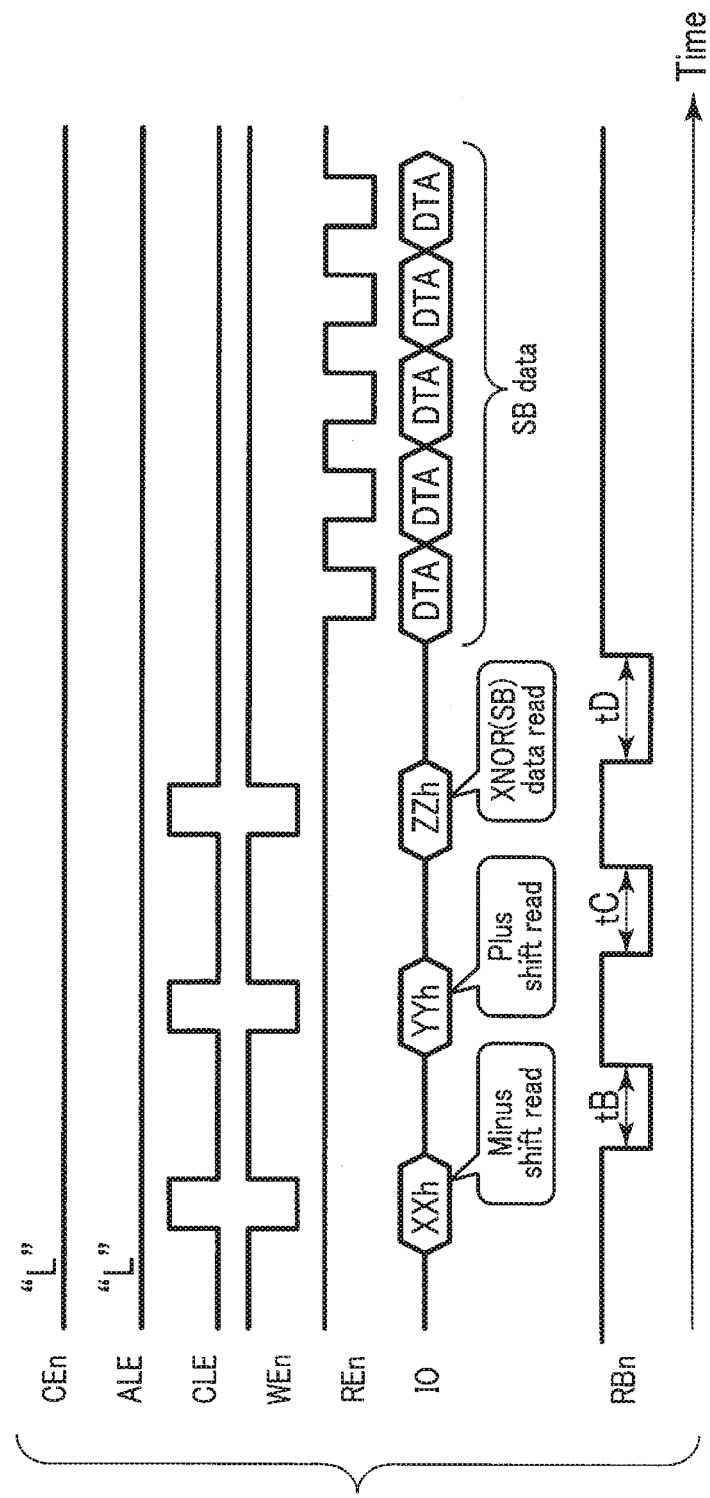
F I G. 8

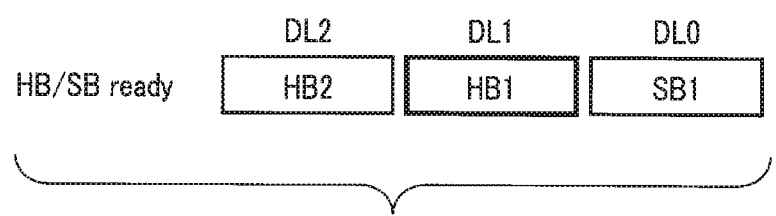
F I G. 13

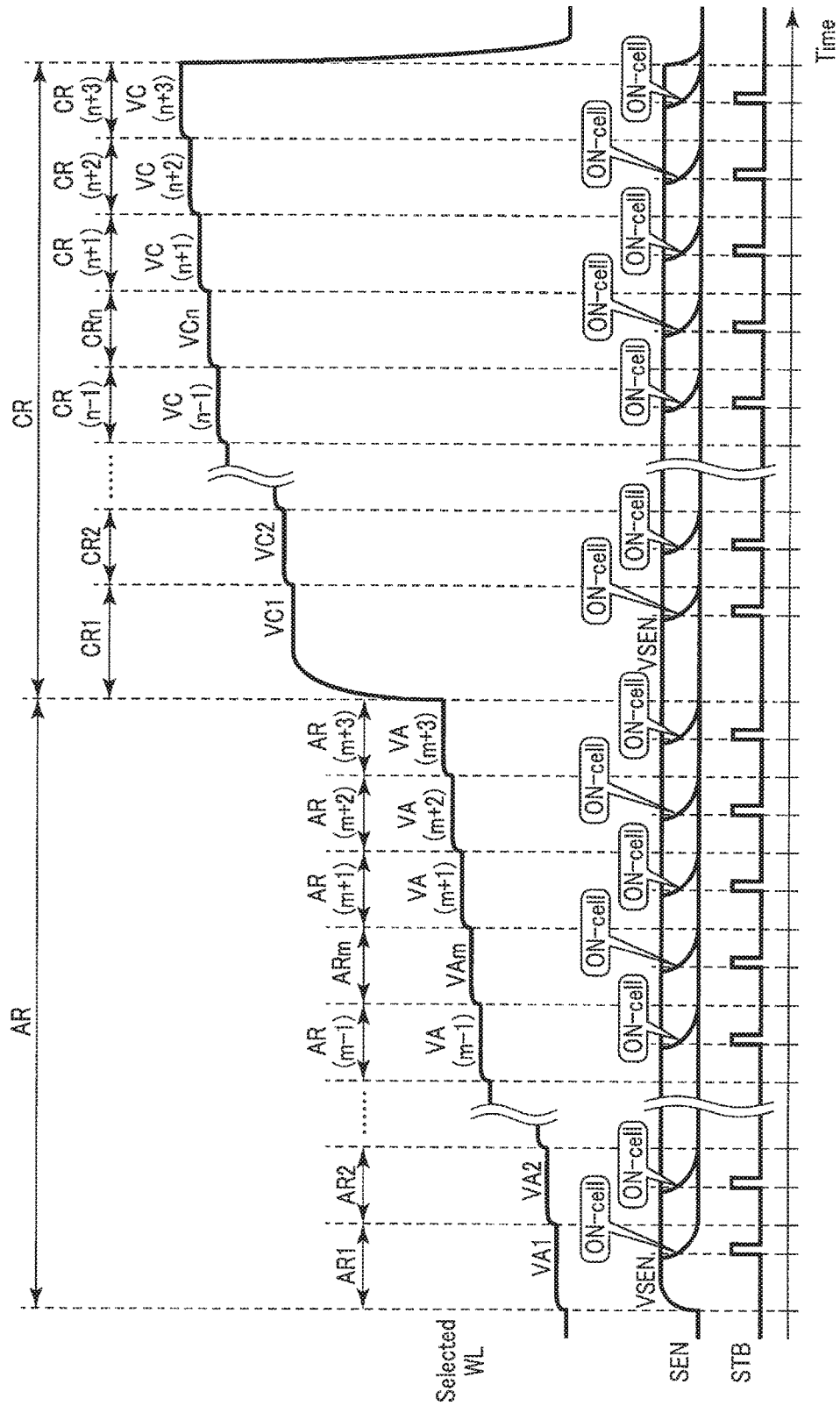
F I G. 14

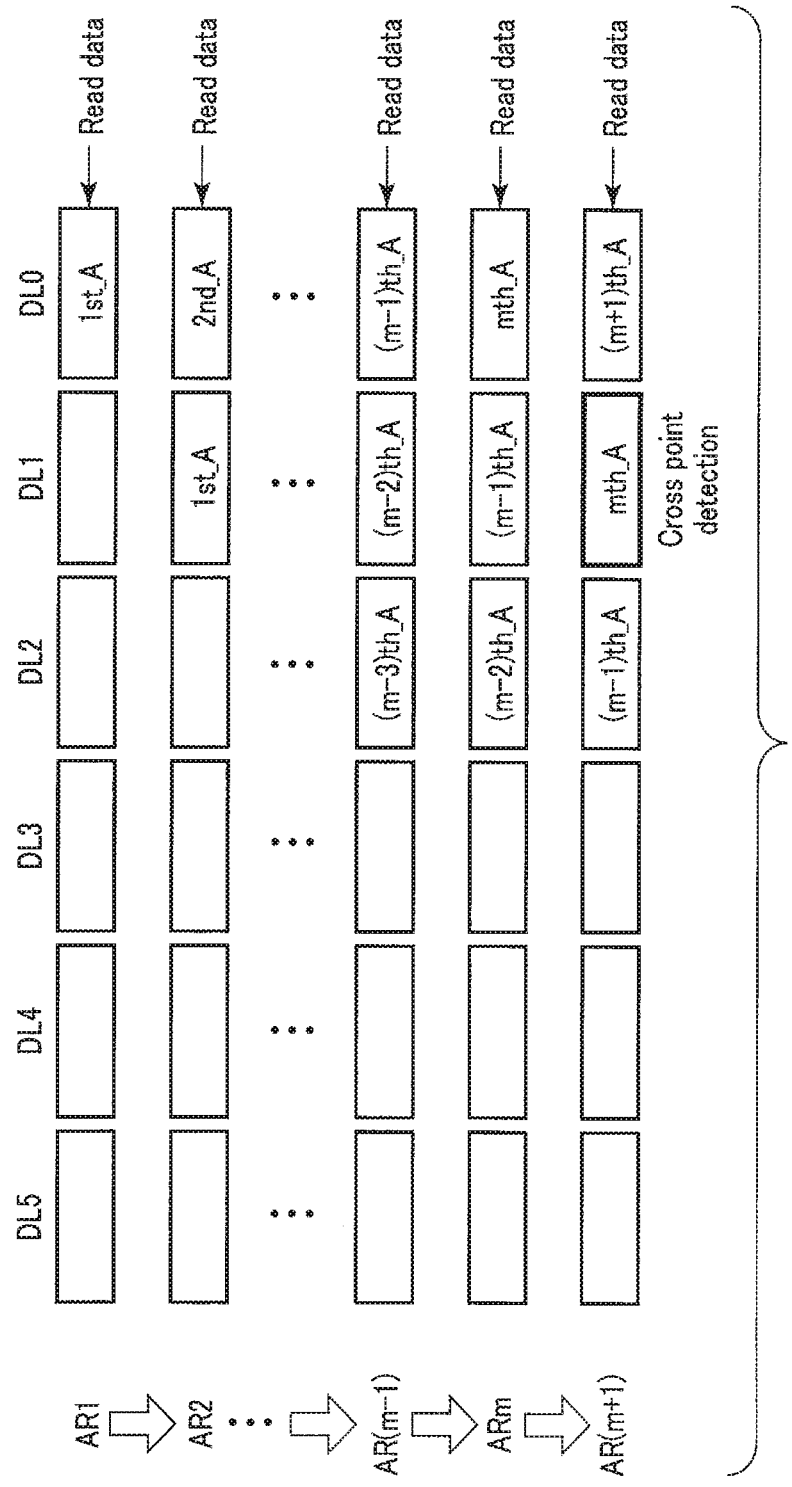
F I G. 15

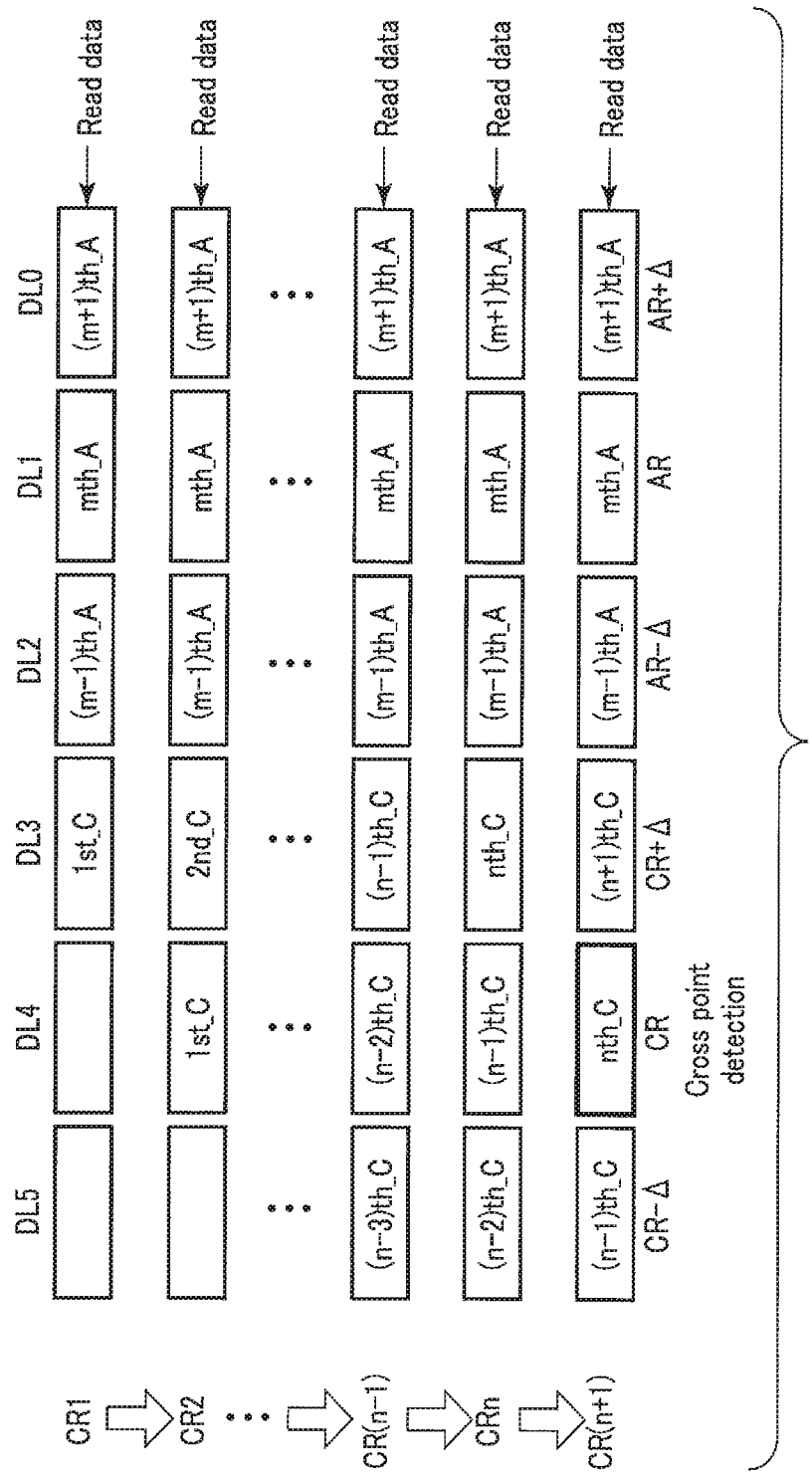
F I G. 16

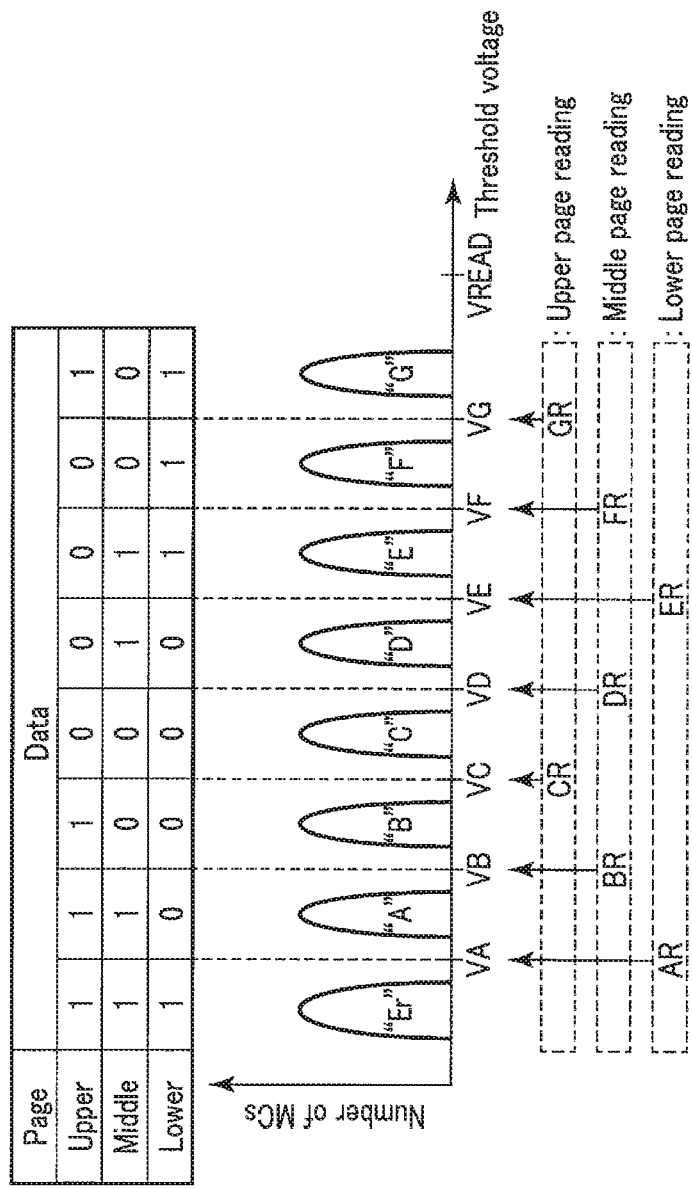
F I G. 18

US 10,297,338 B2

MEMORY SYSTEM

CROSS-REFERENCE TO RELATED APPLICATIONS

This application claims the benefit of U.S. Provisional Application No. 62/396,936, filed Sep. 20, 2016, the entire contents of which are incorporated herein by reference.

FIELD

Embodiments described herein relate generally to a memory system.

BACKGROUND

A NAND flash memory is widespread as a data storage device.

BRIEF DESCRIPTION OF THE DRAWINGS

FIGS. 7 to 9 are timing charts of various signals in the read operation according to the first embodiment;

FIG. 13 is a schematic view of the latch circuits in the read operation according to the first embodiment;

FIG. 14 is a timing chart of various signals in the read operation according to the first embodiment;

FIGS. 15 and 16 are schematic views of the latch circuits in the read operation according to the first embodiment;

FIG. 18 is a graph showing possible threshold distributions of a memory cell according to the second embodiment;

DETAILED DESCRIPTION

In general, according to one embodiment, a memory system includes: a semiconductor memory device including a memory cell array and a latch circuit capable of holding data read from the memory cell array; and a controller capable of issuing a first read instruction and a second read instruction different from the first read instruction. When receiving the first read instruction, the semiconductor memory device reads first data and second data from the memory cell array, holds the first data and the second data in the latch circuit, and outputs the first data to the controller. When receiving the second read instruction, the semiconductor memory device outputs third data based on the second data held by the latch circuit to the controller. The controller performs soft decision processing using the third data.

1. First Embodiment

A memory system according to the first embodiment will be described. A memory system including a NAND flash memory in which memory cells are three-dimensionally arrayed above a semiconductor substrate will be exemplified below.

1.1 Arrangement 1.1.1 Overall Arrangement of Memory System

Figure 1:
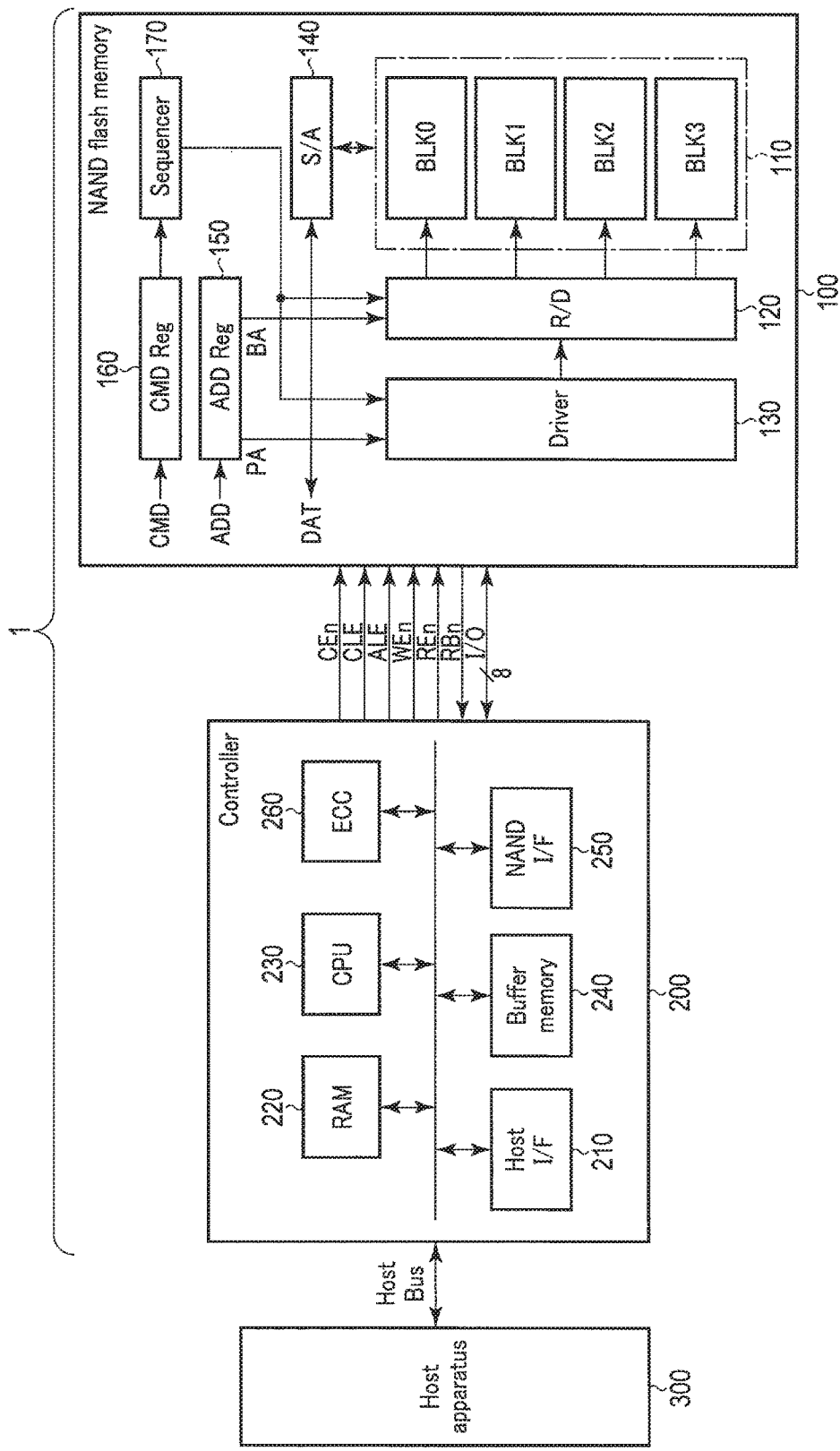
FIG. 1 is a block diagram of a memory system according to the first embodiment.

An overall arrangement of the memory system according to this embodiment will be described first with reference to FIG. 1. FIG. 1 is a block diagram of the memory system according to this embodiment.

As shown in FIG. 1, a memory system 1 includes a NAND flash memory 100 and a controller 200. The NAND flash memory 100 and the controller 200 may form one semiconductor device by, for example, a combination. Examples of the device are a memory card such as an SD™ card and an SSD (Solid State Drive).

The NAND flash memory 100 includes a plurality of memory cells to store data in a nonvolatile manner. The controller 200 is connected to the NAND flash memory 100 by a NAND bus and connected to a host apparatus 300 by a host bus. The controller 200 controls the NAND flash memory 100, and accesses the NAND flash memory 100 in response to an instruction received from the host apparatus 300. The host apparatus 300 is, for example, a digital camera or a personal computer, and the host bus is, for example, a bus complying with an SD™ interface.

The NAND bus transmits/receives signals complying with a NAND interface. Detailed examples of the signals are a chip enable signal CEn, an address latch enable signal ALE, a command latch enable signal CLE, a write enable signal WEn, a read enable signal REn, a ready busy signal RBn, and an input/output signal I/O.

The signal CEn is a signal used to enable the NAND flash memory 100 and is asserted at a low level. The signals CLE and ALE are signals that notify the NAND flash memory 100 that the input signals I/O to the NAND flash memory 100 are a command and an address, respectively. The signal WEn is a signal asserted at a low level and used to make the NAND flash memory 100 to receive the input signal I/O. The signal REn is also a signal asserted at a low level and used to read the output signal I/O from the NAND flash memory 100. The ready busy signal RBn is a signal representing whether the NAND flash memory 100 is in a ready state (a state in which an instruction from the controller 200 can be received) or a busy state (a state in which an instruction from the controller 200 cannot be received), and the low level represents the busy state. The input/output signal I/O is, for example, an 8-bit signal. The input/output signal I/O is the entity of data transmitted/received between the NAND flash memory 100 and the controller 200 and includes a command, an address, write data, read data, and the like.

1.1.2 Arrangement of Controller 200

Details of the arrangement of the controller 200 will be described next with reference to FIG. 1. As shown in FIG. 1, the controller 200 includes a host interface circuit 210, an embedded memory (RAM) 220, a processor (CPU) 230, a buffer memory 240, a NAND interface circuit 250, and an ECC circuit 260.

The host interface circuit 210 is connected to the host apparatus 300 via the host bus to transfer instructions and data received from the host apparatus 300 to the processor 230 and the buffer memory 240. The host interface circuit 210 also transfers data in the buffer memory 240 to the host apparatus 300 in response to an instruction from the processor 230.

The processor 230 controls the operation of the entire controller 200. For example, when receiving a write instruction from the host apparatus 300, in response to the instruction, the processor 230 issues a write instruction to the NAND interface circuit 250. This also applies to read and erase. The processor 230 also executes various processes for managing the NAND flash memory 100 such as wear leveling.

The NAND interface circuit 250 is connected to the NAND flash memory 100 via the NAND bus to communicate with the NAND flash memory 100. Based on an instruction received from the processor 230, the NAND interface circuit 250 outputs the signals CEn, ALE, CLE, WEn, and REn to the NAND flash memory 100. In data writing, the NAND interface circuit 250 transfers a write command issued by the processor 230 and write data in the buffer memory 240 to the NAND flash memory 100 as the input/output signal I/O. In data reading, the NAND interface circuit 250 transfers a read command issued by the processor 230 to the NAND flash memory 100 as the input/output signal I/O, receives data read from the NAND flash memory 100 as the input/output signal I/O, and transfers it to the buffer memory 240.

The buffer memory 240 temporarily holds write data or read data.

The embedded-memory 220 is, for example, a semiconductor memory such as a DRAM, and is used as the work area of the processor 230. The embedded-memory 220 holds firmware, various management tables, and the like that are used to manage the NAND flash memory 100.

The ECC circuit 260 executes error detection and error correction process on the data stored in the NAND flash memory 100. That is, in data writing, the ECC circuit 260 generates an error-correcting code and adds it to write data. In data reading, the ECC circuit 260 decodes the error-correcting code. As the error-correcting code, a hard decision decoding code such as a BCH code or an RS (Reed-Solomon) code and a soft decision decoding code such as an LDPC (Low-Density Parity-Check) code may be used.

1.1.3 Arrangement of NAND Flash Memory 100

1.1.3.1 Overall Arrangement of NAND Flash Memory 100

The arrangement of the NAND flash memory 100 will be described next. As shown in FIG. 1, the NAND flash memory 100 includes a memory cell array 110, a row decoder 120, a driver circuit 130, a column control circuit 140, an address register 150, a command register 160, and a sequencer 170.

The memory cell array 110 includes, for example, four blocks BLK (BLK0 to BLK3) each including a plurality of nonvolatile memory cells associated with rows and columns. The memory cell array 110 stores data given by the controller 200.

The row decoder 120 selects one of the blocks BLK0 to BLK3, and further selects a row direction in the selected block BLK.

The driver circuit 130 applies a voltage to the selected block BLK via the row decoder 120.

In data reading, the column control circuit 140 senses data read from the memory cell array 110 and executes the required operations. The column control circuit 140 outputs data DAT to the controller 200. In data writing, the column control circuit 140 transfers the write data DAT received from the controller 200 to the memory cell array 110.

The address register 150 holds an address ADD received from the controller 200. The command register 160 holds a command CMD received from the controller 200.

The sequencer 170 controls the operation of the entire NAND flash memory 100 based on the command CMD held by the command register 160.

1.1.3.2 Arrangement of Block BLK

Figure 2:
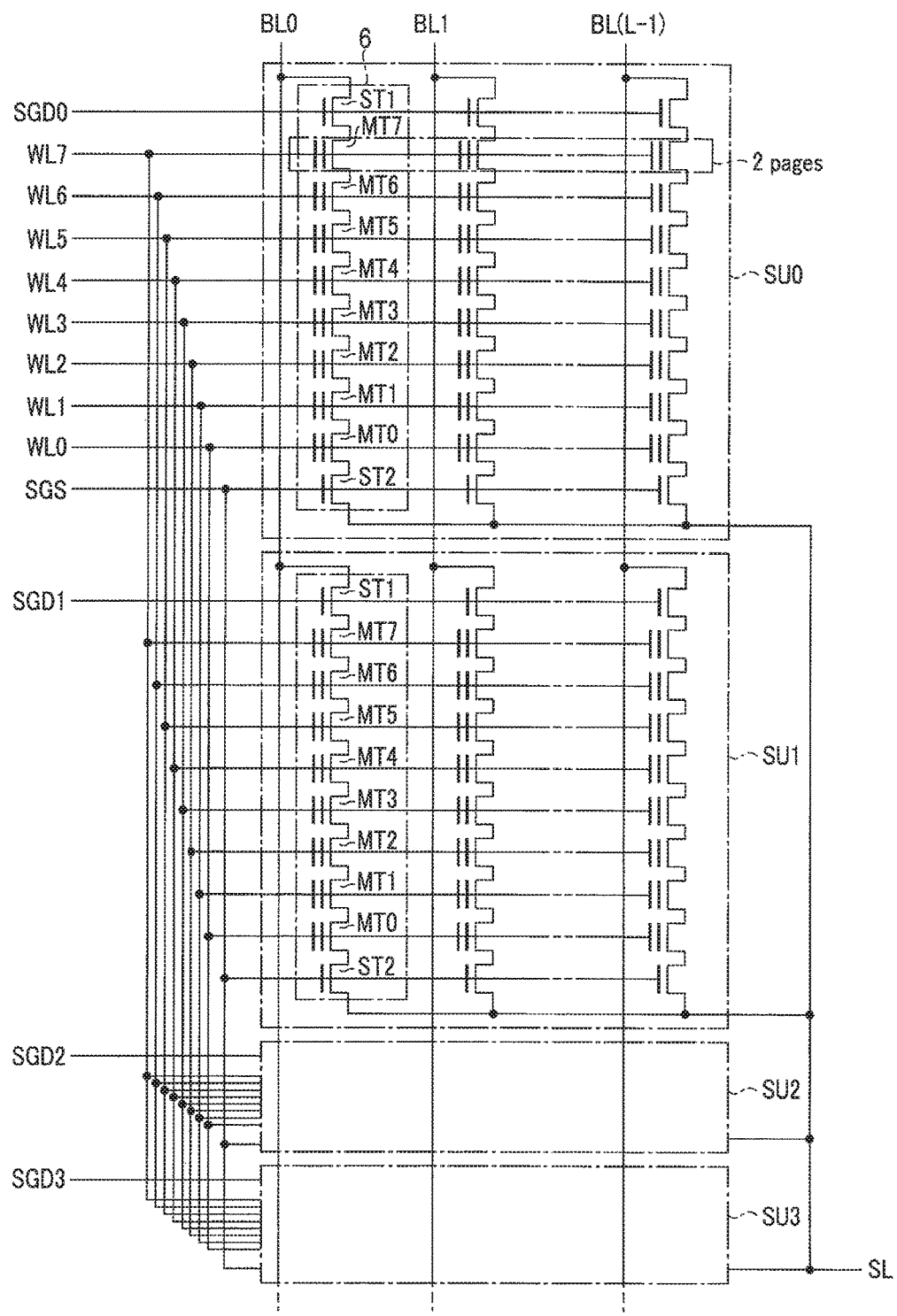
FIGS. 2 and 3 are a circuit diagram and a sectional view, respectively, of a memory cell array according to the first embodiment.

The arrangement of the block BLK will be described next with reference to FIG. 2. FIG. 2 is a circuit diagram of a block BLK.

As shown in FIG. 2, the block BLK includes, for example, four string units SU (SU0 to SU3). Each string unit SU includes a plurality of NAND strings 6. The number of block BLKs in the memory cell array 110 and the number of string units in each block are arbitrary.

Each NAND string 6 includes, for example, eight memory cell transistors MT (MT0 to MT7) and selection transistors ST1 and ST2. Each memory cell transistor MT includes a control gate and a charge accumulation layer and holds data in a nonvolatile manner. The memory cell transistors MT are connected in series between the source of the selection transistor ST1 and the drain of the selection transistor ST2.

The gates of the selection transistors ST1 in the string units SU0 to SU3 are connected to selection gate lines SGD0 to SGD3. On the other hand, the gates of the selection transistors ST2 in the string units SU0 to SU3 are commonly connected to, for example, a selection gate line SGS. The gates of the selection transistors ST2 may be connected to different selection gate lines SGS0 to SGS3 on a string unit basis, as a matter of course. The control gates of the memory cell transistors MT1 to MT7 in the same block BLK are commonly connected to word lines WL0 to WL7, respectively.

The drains of the selection transistors ST1 of the NAND strings 6 on the same column in the memory cell array 110 are commonly connected to a bit line BL (BL0 to BL(L-1), where L is a natural number of 2 or more). That is, the bit line BL commonly connects the NAND strings 6 in the plurality of blocks BLK. The sources of the selection transistors ST2 are commonly connected to a source line SL.

That is, the string unit SU includes a set of NAND strings 6 connected to different bit lines BL and connected to the same selection gate line SGD. The block BLK includes a set of a plurality of string units SU that share the word lines WL. The memory cell array 110 includes a set of a plurality of blocks BLK that share the bit lines BL.

Figure 3:
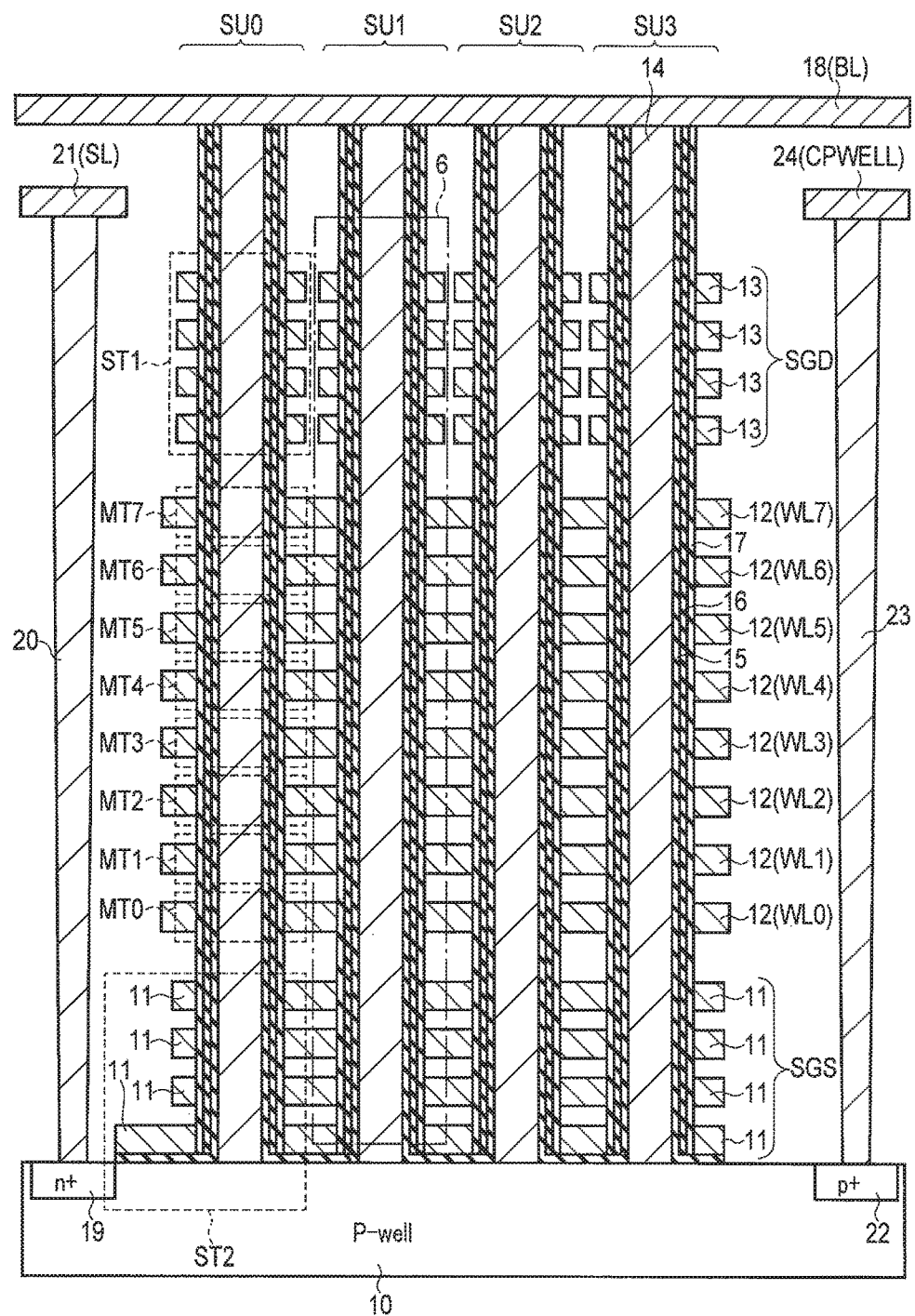

FIG. 3 is a sectional view of a partial region of the block BLK. As shown in FIG. 3, the plurality of NAND strings 6 is formed on a p-type well region 10. That is, for example, four interconnection layers 11 functioning as the selection gate lines SGS, eight interconnection layers 12 functioning as the word lines WL0 to WL7, and, for example, four interconnection layers 13 functioning as the selection gate lines SGD are sequentially stacked above the well region 10. Insulating films (not shown) are formed between the stacked interconnection layers.

Pillar-shaped conductors 14 extending through the interconnection layers 13, 12, and 11 and reaching the well region 10 are formed. A gate insulating film 15, a charge accumulation layer (an insulating film or a conductive film) 16, and a block insulating film 17 are sequentially formed on the side surfaces of the conductors 14. The memory cell transistors MT and the selection transistors ST1 and ST2 are thus formed. Each conductor 14 functions as the current path of the NAND string 6 and the channels of the transistors are formed in the conductor 14. The upper ends of the conductors 14 are connected to a metal interconnection layer 18 functioning as the bit line BL.

An $n^+$-type impurity diffusion layer 19 is formed in the surface region of the well region 10. A contact plug 20 is formed on the diffusion layer 19. The contact plug 20 is connected to a metal interconnection layer 21 functioning as the source line SL. In addition, a $p^+$-type impurity diffusion layer 22 is formed in the surface region of the well region 10. A contact plug 23 is formed on the diffusion layer 22. The contact plug 23 is connected to a metal interconnection layer 24 functioning as a well interconnect CPWELL. The well interconnect CPWELL is used to apply a potential to the conductors 14 via the well region 10.

A plurality of arrangements described above is arrayed in the depth direction of the sheet of FIG. 3. The string unit SU is formed by a set of the plurality of NAND strings 6 arranged in the depth direction.

In this example, one memory cell transistor MT can hold, for example, 2-bit data. The bits of the 2-bit data will be referred to as a lower bit and an upper bit sequentially from the lower side. A set of lower bits held by memory cells connected to the same word line will be referred to as a lower page, and a set of upper bits will be referred to as an upper page. That is, two pages are assigned to one word line WL, and the block BLK including eight word lines WL has a capacity of 16 pages. In other words, "page" may be defined as a part of a memory space formed by memory cells connected to the same word line. Data writing and reading may be executed on a page basis (this read method will be referred to as page-by-page reading).

Data erase may be executed for each block BLK or a unit smaller than the block BLK. An erase method is described in, for example, U.S. patent application Ser. No. 13/235,389 filed on Sep. 18, 2011 and entitled "NONVOLATILE SEMICONDUCTOR MEMORY DEVICE." An erase method is also described in, for example, U.S. patent application Ser. No. 12/694,690 filed on Jan. 27, 2010 and entitled "NONVOLATILE SEMICONDUCTOR STORAGE DEVICE." An erase method is also described in, for example, U.S. patent application Ser. No. 13/483,610 filed on May 30, 2012 and entitled "NONVOLATILE SEMICONDUCTOR MEMORY DEVICE AND DATA ERASE METHOD THEREOF." These patent applications are incorporated by reference in this specification in their entirety.

The memory cell array 110 may have another arrangement. That is, an arrangement of the memory cell array 110 is described in, for example, U.S. patent application Ser. No. 12/407,403 filed on Mar. 19, 2009 and entitled "THREE DIMENSIONAL STACKED NONVOLATILE SEMICONDUCTOR MEMORY." The configuration is also described in U.S. patent application Ser. No. 12/406,524 filed on Mar. 18, 2009 and entitled "THREE DIMENSIONAL STACKED NONVOLATILE SEMICONDUCTOR MEMORY", U.S. patent application Ser. No. 12/679,991 filed on Mar. 25, 2010 and entitled "NONVOLATILE SEMICONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND METHOD FOR MANUFACTURING SAME". These patent applications are entirely incorporated herein by reference.

1.1.3.3 Arrangement of Column Control Circuit 140

Figure 4:
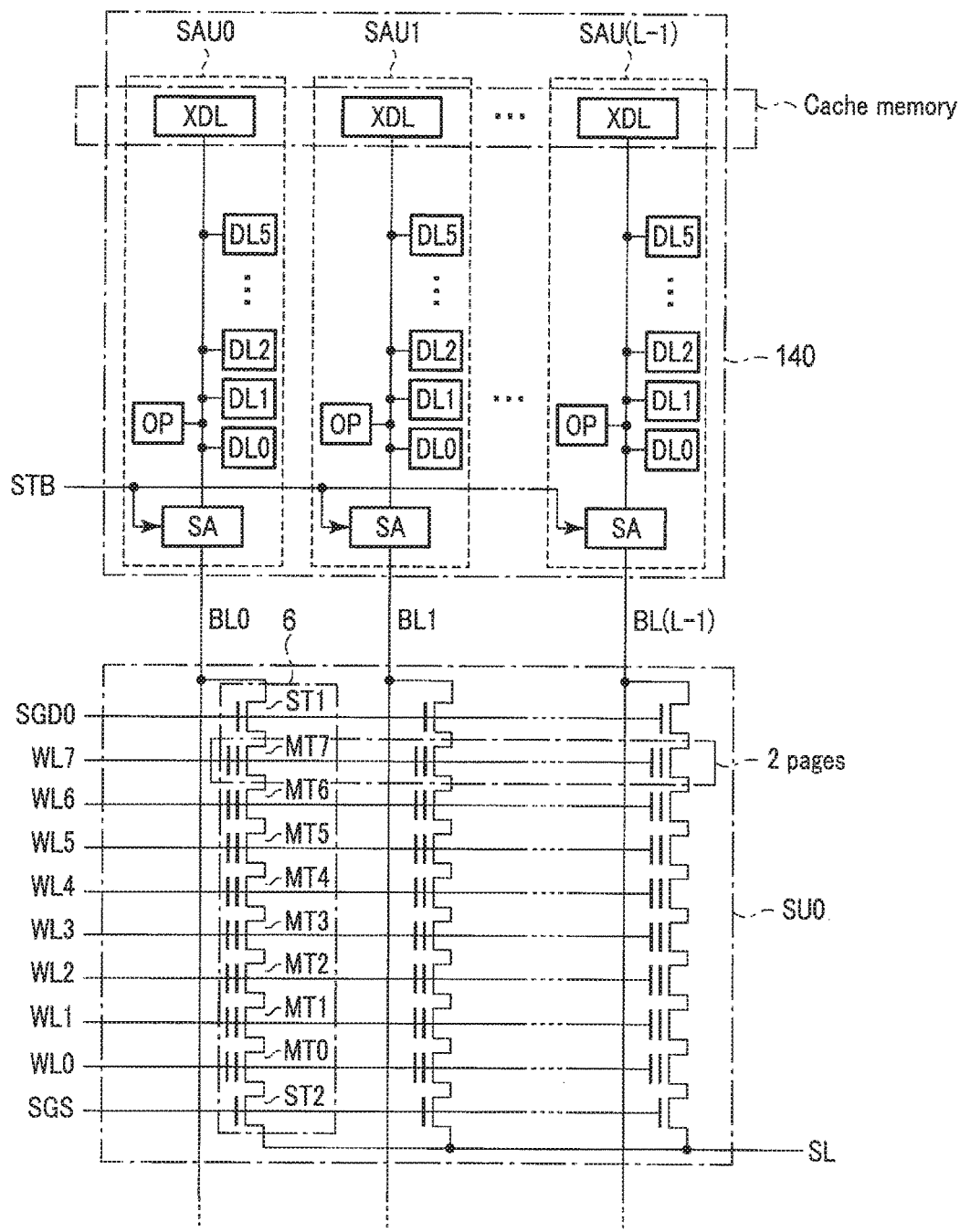
FIG. 4 is a circuit diagram of the memory cell array and a sense amplifier according to the first embodiment.

The arrangement of the column control circuit 140 will be described next with reference to FIG. 4. FIG. 4 is a circuit diagram of the column control circuit 140 and the string unit SU0 according to this embodiment.

As shown in FIG. 4, the column control circuit 140 includes a sense unit SAU (SAU0 to SAU(L−1)) provided for each bit line BL.

Each of the sense units SAU includes a sense amplifier SA, an operation unit OP, and latch circuits DL0 to DL5 and XDL.

The sense amplifier SA senses data read onto the corresponding bit line BL, and applies a voltage to the bit line BL in accordance with write data. That is, the sense amplifier SA is a module that directly controls the bit line BL. In data reading, a strobe signal STB is given from, for example, the sequencer 170 to the sense amplifier SA. The sense amplifier SA determines data at the assertion timing of the signal STB (in this example, an ON state of a memory cell is defined as data "0", and an off state is defined as data "1"). This data is held by an internal latch circuit (not shown in FIG. 4) and then transferred to one of the latch circuits DL0 to DL5 and XDL.

The latch circuits DL0 to DL5 temporarily hold read data and write data. The operation unit OP performs various logical operations such as an inversion (NOT) operation, a logical sum (OR) operation, a logical product (AND) operation, an exclusive OR (XOR) operation, and an exclusive NOR (XNOR) operation for data held by the sense amplifier SA and the latch circuits DL0 to DL5 and XDL.

The sense amplifier SA, the latch circuits DL0 to DL5 and XDL, and the operation unit OP are connected by a bus so as to transmit/receive data to/from each other. The bus is further connected to the latch circuit XDL.

Input and output of data to and from the sense amplifier 140 are performed via the latch circuit XDL. That is, data received from the controller 200 is transferred to the latch circuits DL0 to DL5 or the sense amplifier SA via the latch circuit XDL. In addition, data in the latch circuits DL0 to DL5 or the sense amplifier SA is transmitted to the controller 200 via the latch circuit XDL. The latch circuit XDL functions as the cache memory of the NAND flash memory 100. Hence, even if the latch circuits DL0 to DL5 are in use, the NAND flash memory 100 can be set in a ready state as long as the latch circuit XDL is available.

1.2 Data Read Operation

The read operation of the memory system according to this embodiment will be described next.

1.2.1 Held Data and Threshold Voltage of Memory Cell Transistor

Figure 5:
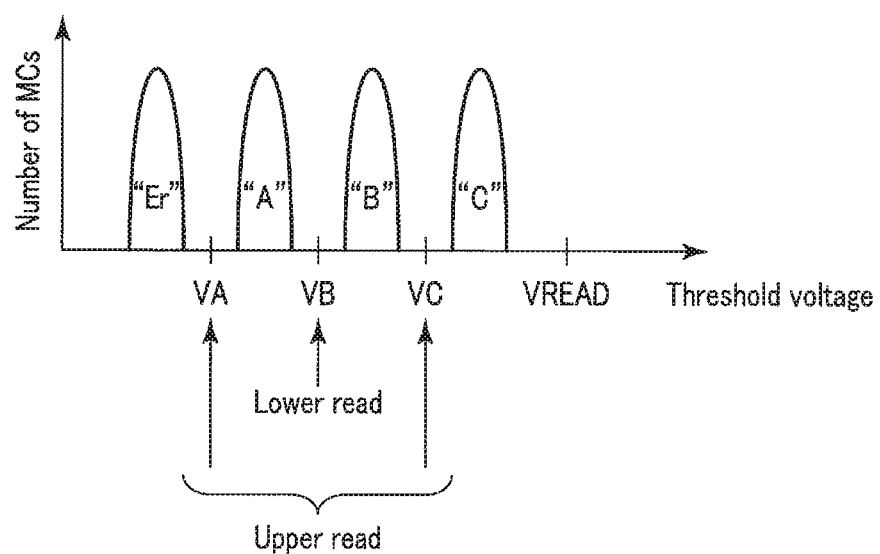
FIG. 5 is a graph showing possible threshold distributions of a memory cell according to the first embodiment.

The held data, threshold voltage, and data read levels of the memory cell transistor MT will be described first with reference to FIG. 5. FIG. 5 is a diagram showing data and possible threshold distributions of each memory cell transistor MT and voltages used in reading.

As described above, the memory cell transistor MT can take four states in accordance with the threshold voltage. The four states will be referred to as an "Er" state, "A" state, "B" state, and "C" state in ascending order of threshold voltage. The threshold voltage of the memory cell transistor MT in the "Er" state is less than a voltage VA, and this state corresponds to a data erase state. The threshold voltage of the memory cell transistor MT in the "A" state is equal to or higher than the voltage VA and lower than a voltage VB (>VA). The threshold voltage of the memory cell transistor MT in the "B" state is equal to or higher than the voltage VB and lower than a voltage VC (>VB). The threshold voltage of the memory cell transistor MT in the "C" state is equal to or higher than the voltage VC and lower than a voltage VREAD. Note that VREAD is the voltage applied to an unselected word line in the read operation. This voltage turns on the memory cell transistor MT regardless of held data.

In page-by-page reading, the upper page is read using, for example, the voltages VA and VC as read voltages (these operations will be referred to as read operations AR and CR, respectively). That is, for example, by upper page reading, whether the threshold voltage of the memory cell transistor is the "Er" state or one of the "A" to "C" states is determined, and whether the threshold voltage is the "C" state or one of the "Er" to "B" states is determined. The lower page is read using the voltage VB (this operation will be referred to as a read operation BR). By lower page reading, whether the threshold voltage is the "Er" or "A" state, or the "B" or "C" state is determined.

1.2.2 Overall Procedure of Read Operation

Figure 6:
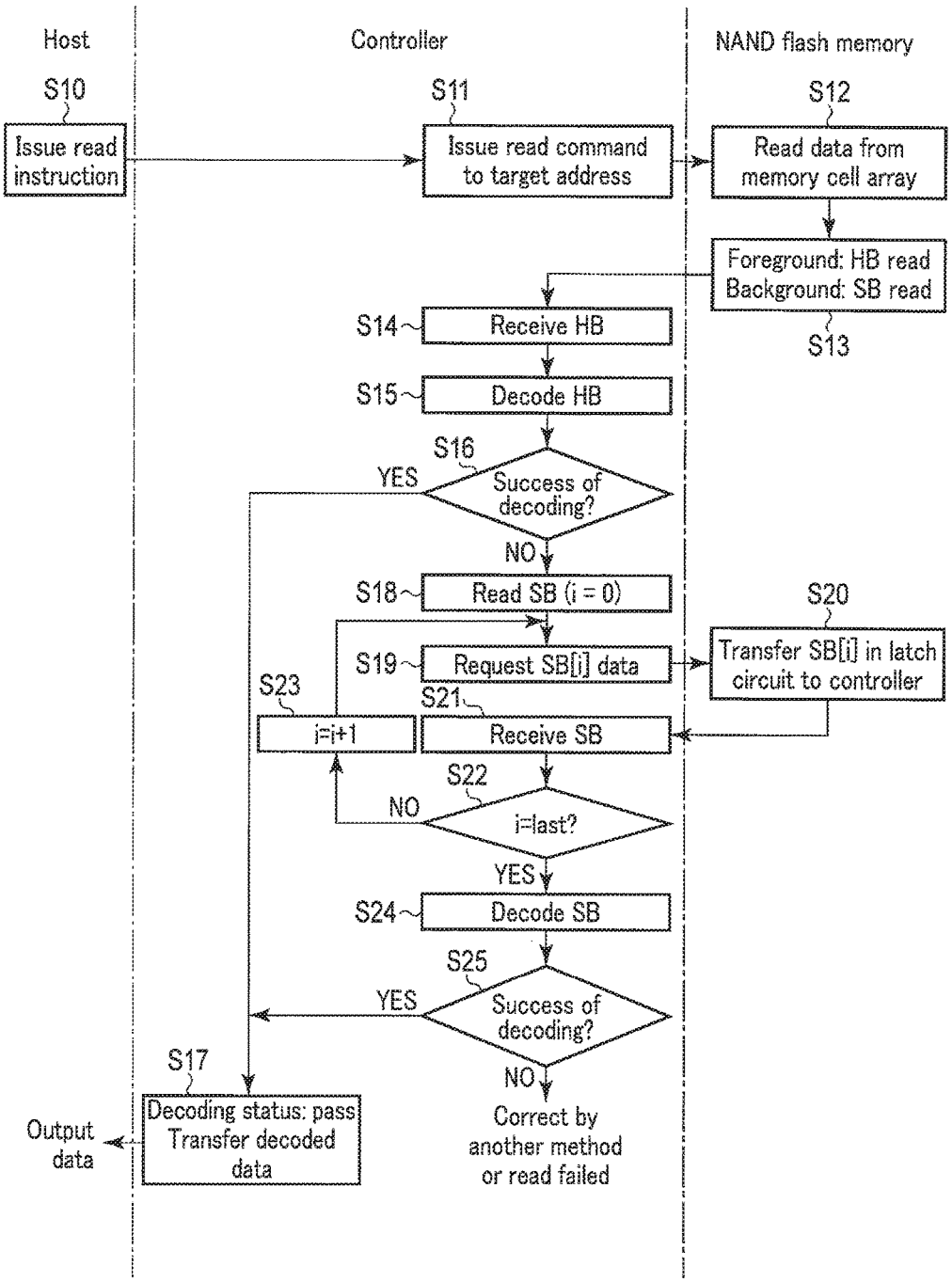
FIG. 6 is a flowchart of a read operation according to the first embodiment.

FIG. 6 is a flowchart showing the overall procedure of the read operation.

As shown in FIG. 6, first, the host apparatus 300 issues a read instruction to the controller 200 (step S10). In response to the received read instruction, the processor 230 of the controller 200 designates an address at which the requested data is held and issues a read command (step S11). When receiving the read command, the NAND flash memory 100 reads data in units of page from an area corresponding to the designated address in the memory cell array 110 (step S12).

At this time, in the NAND flash memory 100, data is read from the memory cell array 110 using a plurality of read voltages, and the read data is held by a latch circuit DL in the sense unit SAU. The read voltage is, for example, a voltage applied to the selected word line WL. The NAND flash memory 100 transmits data read by one of the read voltages to the controller 200. Data read by the other read voltages is held in the latch circuits in the sense unit SAU without being transmitted to the controller 200. The data transmitted to the controller 200 will be referred to as a hard bit HB, and an operation of reading a hard bit will be referred to as a hard bit reading. On the other hand, reading data using a plurality of read voltages, including data that is not transmitted to the controller 200, will be referred to as soft bit SB reading (step S13).

The processor 230 of the controller 200 that has received the hard bit tries to detect and correct an error by the ECC circuit 260 (steps S14 and S15). The process of step S15 is decoding using hard decision processing and will sometimes be referred to as hard bit decoding or hard decision decoding. An example of hard decision decoding is the above-mentioned BCH decoding.

If decoding succeeds (YES in step S16), the controller 200 transmits the decoded data to the host apparatus 300 while representing the success of decoding as status information (step S17).

If hard bit decoding fails (NO in step S16), the processor 230 tries to perform decoding using soft decision processing by the ECC circuit 260 (step S18). Decoding using soft decision processing will sometimes be referred to as soft bit decoding or soft decision decoding.

First, the processor 230 issues a command to the NAND flash memory 100 and requests soft bit SB[i] data (step S19), where i is a natural number of 1 or more, and the soft bit SB data may include a plurality of soft bits data items. In the NAND flash memory 100 that has received the command issued in step S19, the sense unit SAU generates the soft bit SB[i] using data held by the latch circuit DL, and transmits it to the controller 200 (steps S20 and S21). If there is a plurality of soft bits SB data items, the above-described process is repeated (steps S22 and S23). At this time, in the NAND flash memory 100, the operation for reading data from the memory cell array 110 to obtain the soft bit SB is not performed, and the soft bit SB is generated by the data held by the latch circuit in the sense unit SAU.

If the requested soft bit SB is read to the controller 200, the ECC circuit 260 performs soft decision decoding using the soft bit SB (step S24). An example of soft decision decoding is the above-mentioned LDPC decoding. If decoding succeeds (YES in step S25), the process proceeds to step S17, and the decoded data is transmitted to the host apparatus 300. On the other hand, if decoding fails (NO in step S25), the ECC circuit 260 tries to correct by another method, or it is determined that the read operation fails, and the processing ends.

1.2.3 Command Sequence

Figure 7:
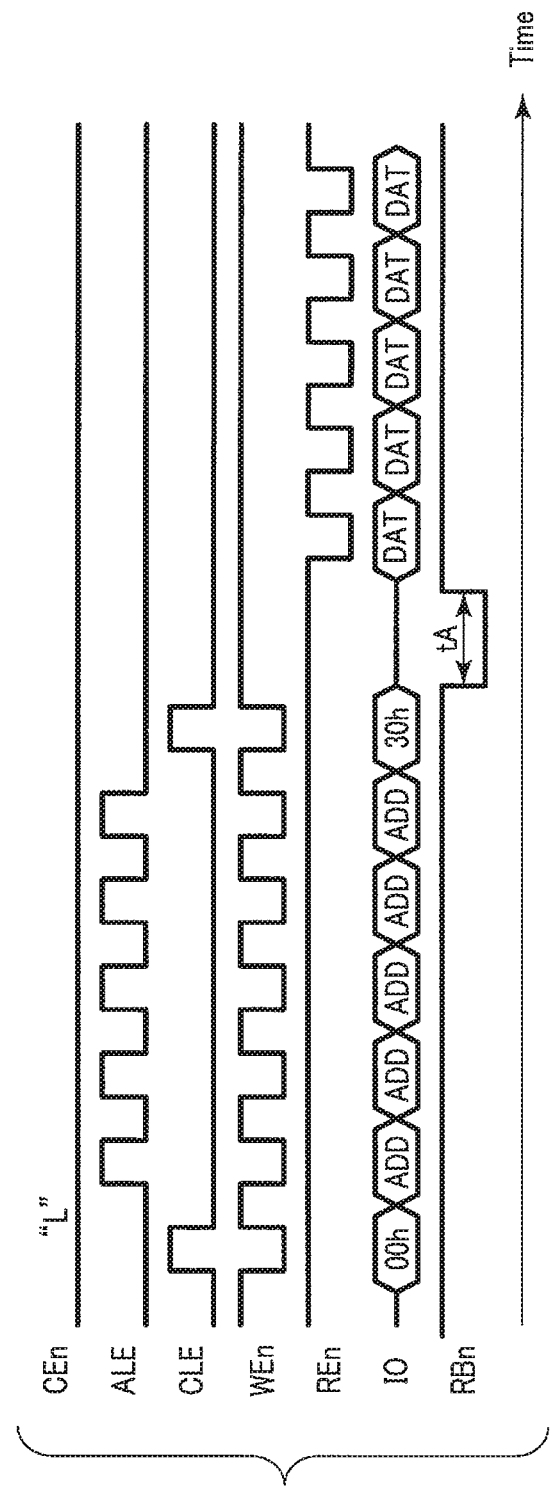

The command sequence of the read operation will be described next. FIG. 7 shows a command sequence when the controller 200 reads hard bit data from the NAND flash memory 100. FIG. 7 is a timing chart of signals on the NAND bus in steps S11 to S14 (hard bit reading) described with reference to FIG. 6.

As shown in FIG. 7, the processor 230 of the controller 200 issues a command "00h" defined by the NAND interface, and asserts the signal CLE. The command "00h" is a command that declares transmission of an address. Subsequently, the processor 230 issues addresses (including a block address and a page address) in, for example, five cycles, and asserts the signal ALE. After that, the processor 230 issues a command "30h", and asserts the signal CLE. The command "30h" is a signal used to cause the NAND flash memory 100 to start data read from the memory cell array 110.

If the command "30h" is set in the command register 160, the sequencer 170 of the NAND flash memory 100 starts the data read operation from the memory cell array 110, and the NAND flash memory 100 changes to the busy state. In the memory cell array 110, one page data is read from an area corresponding to the address transmitted from the controller 200 and is held by the latch circuit DL in the sense unit SAU.

After that, when the NAND flash memory 100 changes to the ready state, the processor 230 of the controller 200 repetitively asserts the signal REn. Every time the signal REn is toggled, data (hard bit) read from the memory cell array 110 is transmitted to the controller 200. As described above, in the NAND flash memory 100, data is read from the same address region using a plurality of read voltages. Data transmitted to the controller 200 in steps S13 and S14 is data obtained by one of the read voltages. Details will be described in section 1.2.4.

The command sequence when the controller 200 reads soft bit data from the NAND flash memory 100 will be described next with reference to FIG. 8. FIG. 8 is a timing chart of the signals on the NAND bus in steps S19 to S21 described with reference to FIG. 6.

As shown in FIG. 8, the processor 230 of the controller 200 issues a command "XXh" and asserts the signal CLE. The command "XXh" is a command that instructs to execute processing for shift reading on the negative side to obtain the soft bit SB. Details will be described in section 1.2.4. To obtain the soft bit SB, data read using voltages on the positive and negative sides of the read voltage used in hard bit reading are used. The command "XXh" instructs the NAND flash memory 100 to execute processing using data read by the voltage on the negative side. If the command "XXh" is set in the command register 160, the operation unit OP in the sense unit SAU of the NAND flash memory 100 starts a predetermined operation, and the NAND flash memory 100 changes to the busy state. Details of the operation in the sense unit SAU will also be described in section 1.2.4.

Next, when the NAND flash memory 100 changes to the ready state, the processor 230 issues a command "YYh" and asserts the signal CLE. The command "YYh" is a command that instructs to execute processing concerning shift reading on the positive side to obtain the soft bit SB. If the command "YYh" is set in the command register 160, the operation unit OP in the sense unit SAU of the NAND flash memory 100 starts a predetermined operation, and the NAND flash memory 100 changes to the busy state.

Next, when the NAND flash memory 100 changes to the ready state, the processor 230 issues a command "ZZh" and asserts the signal CLE. The command "ZZh" is a command that instructs to execute an operation to obtain the soft bit SB (for example, the XNOR operation of the data obtained by the command "XXh" and the data obtained by the command "YYh"). When the command "ZZh" is set in the command register 160, the operation unit OP in the sense unit SAU of the NAND flash memory 100 starts a predetermined operation, and the NAND flash memory 100 changes to the busy state.

After that, when the NAND flash memory 100 changes to the ready state, the processor 230 repetitively asserts the signal REn. Every time the signal REn is toggled, the soft bit SB is transmitted to the controller 200.

1.2.4 Details of Operation of NAND Flash Memory

Details of the operation of the NAND flash memory 100 in the read operation will be described next.

1.2.4.1 Lower Page Reading

A case in which a lower page is read will be described first.

<Hard Bit Reading>

Figure 9:
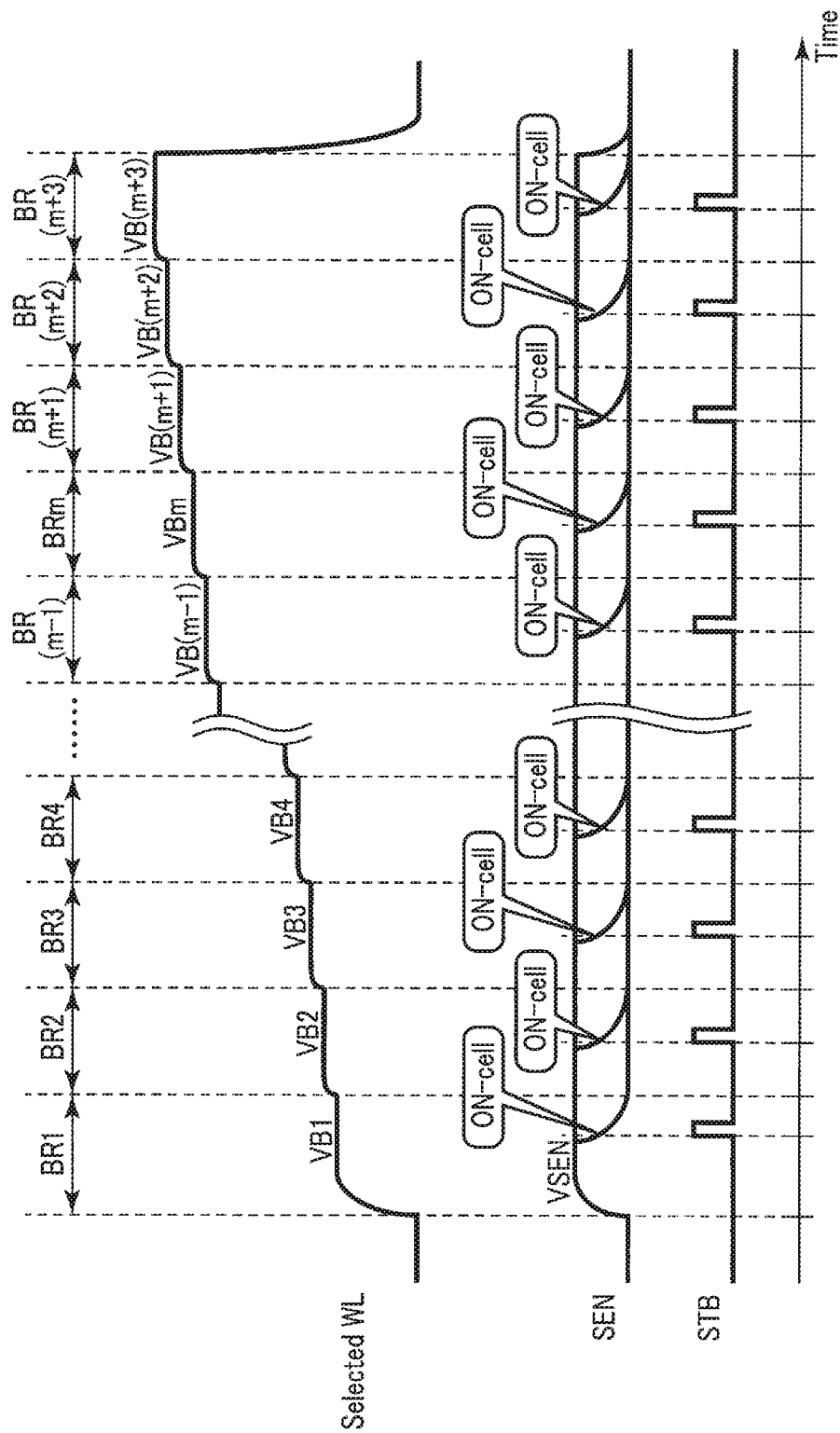

First, the operation described concerning steps S12 and S13 of FIG. 6 will be explained. FIG. 9 is a timing chart of the selected word line WL, a node SEN, and the signal STB when a lower page is set to the read target in step S11 of FIG. 6. FIG. 9 shows the state of the read operation BR. Note that the node SEN is a node included in the sense amplifier SA. The potential of the node SEN varies depending on whether the memory cell transistor MT connected to the selected word line WL changes to the ON state or OFF state. Based on the variation amount, it is determined whether data is "0" or "1".

As shown in FIG. 9, the row decoder 120 applies a read voltage VCGRV to the selected word line WL. The value of the read voltage VCGRV is stepped up a plurality of times. In the example of FIG. 9, the read voltage VCGRV is stepped up (m+3) times from a voltage VB1 to VB(m+3), where m is a natural number of 2 or more. Every time the read voltage VCGRV is stepped up from the voltage VB1 to VB(m+3), the strobe signal STB is asserted, and data is read. Read operations using the voltages VB1 to VB(m+3) will be referred to as read operations BR1 to BR(m+3), respectively, hereinafter.

The bit line BL is precharged to, for example, 0.7 V by the sense amplifier SA. If the memory cell transistor MT is turned on when the voltage VCGRV is applied to the selected word line WL, a current flows from the bit line BL to the source line SL and the potential of VSEN lowers. If the potential of VSEN is lower than a predetermined potential when the signal STB is asserted, it is determined that the memory cell transistor MT is in the ON state, that is, data held by the memory cell transistor MT corresponding to the bit line BL is "0". The bit line BL whose data is determined to be "0" in one of the read operation1 BR1 to BR(m+2) is fixed to a predetermined potential (for example, 0 V) and excluded from the read target.

As described above, under the control of the sequencer 170, the read operation is repeated a plurality of times while raising the voltage of the selected word line WL.

Figure 10:
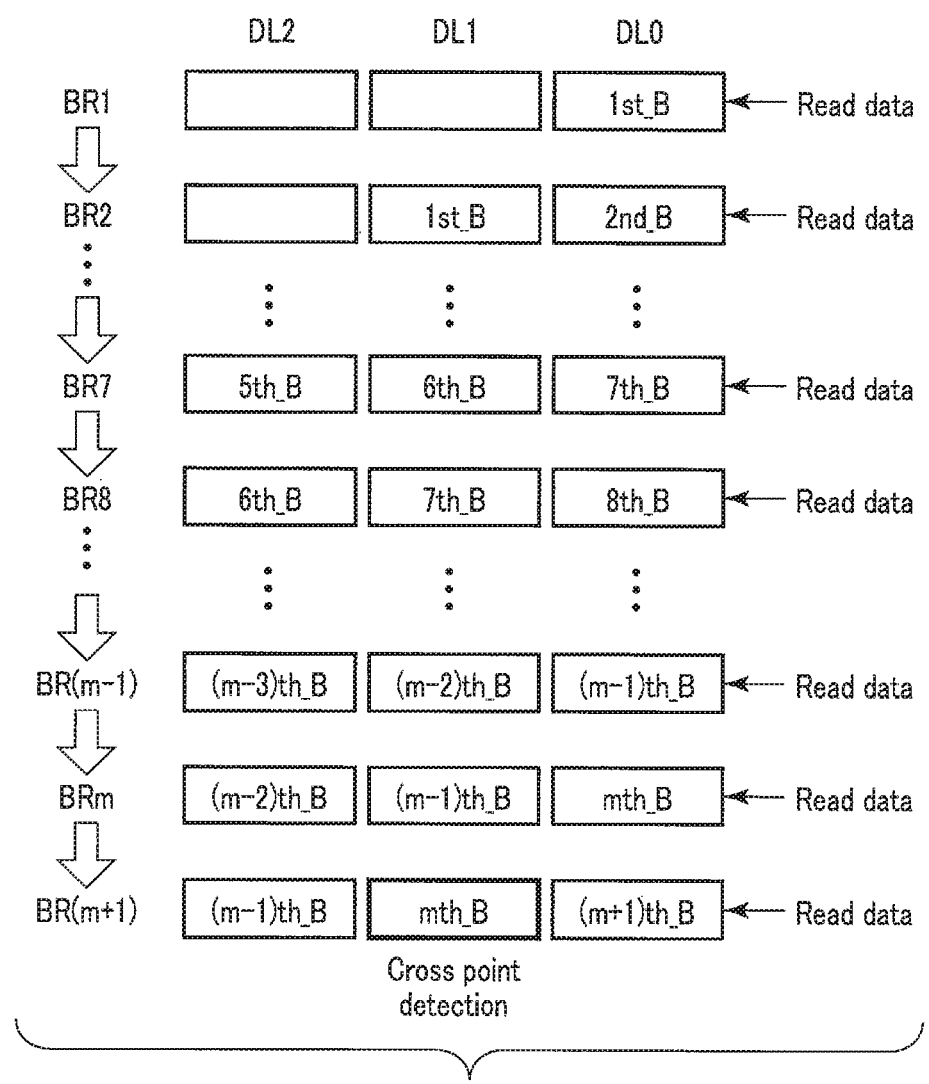
FIG. 10 is a schematic view of latch circuits in the read operation according to the first embodiment.

FIG. 10 is a schematic view showing the states of the latch circuits DL0 to DL2 in the sense unit SAU when performing the operation shown in FIG. 9. In the read operation BR, a half of the six latch circuits DL0 to DL5, that is, the three latch circuits DL0 to DL2 are used.

As shown in FIG. 10, data "1st_B (the value of the data is inverted data of the read result, and is "1" in the ON state or "0" in the OFF state)" read by the read operation BR1 is first held by the latch circuit DL0. When the read operation BR2 is executed next, the data "1st_B" in the latch circuit DL0 is transferred to the latch circuit DL1, and data "2nd_B" read by the read operation BR2 is held by the latch circuit DL0.

In this way, data read every time the voltage of the selected word line WL is stepped up is first held by the latch circuit DL0 and then transferred in the order of the latch circuits DL1 and DL2. Hence, all the latch circuits DL0 to DL2 are used in the third read operation BR3. From the fourth read operation BR4, the oldest data at that time, that is, the data held by the latch circuit DL2 until immediately before the read operation BR4 is executed is discarded.

Hence, in, for example, the seventh read operation BR7, the latch circuit DL0 holds data "7th_B" read by the read operation BR7, the latch circuit DL1 holds data "6th_B" read by the read operation BR6, and the latch circuit DL2 holds data "5th_B" read by the read operation BR5. This also applies after the read operation BR8.

In the read operation BR(m−1), the latch circuit DL0 holds data "(m−1)th_B", the latch circuit DL1 holds data "(m−2)th_B", and the latch circuit DL2 holds data "(m−3)th_B". In the read operation BRm, the latch circuit DL0 holds data "mth_B", the latch circuit DL1 holds data "(m−1)th_B", and the latch circuit DL2 holds data "(m−2)th_B". In the read operation BR(m+1), the latch circuit DL0 holds data "(m+1)th_B", the latch circuit DL1 holds data "mth_B", and the latch circuit DL2 holds data "(m−1)th_B".

Figure 11:
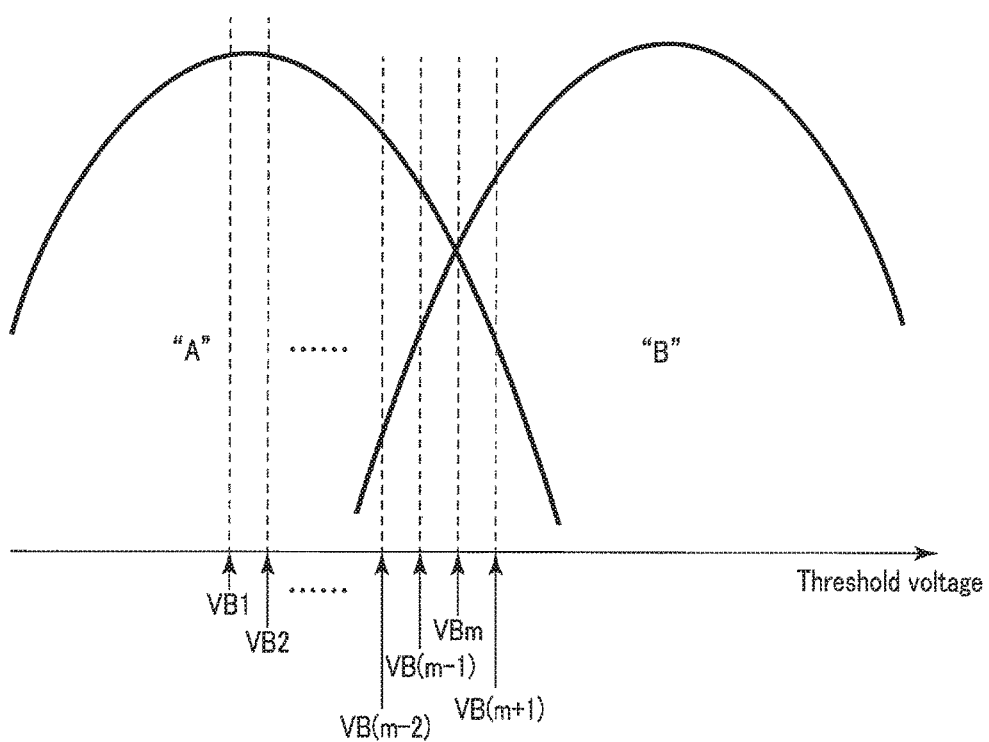
FIG. 11 is a graph showing the threshold distributions of a memory cell.

Every time the read operation is repeated in the above-described way, the operation unit OP or the sequencer 170 calculates the difference between the number of on-bits obtained by the jth read operation and the number of on-bits obtained by the (j−1)th read operation, where j is a natural number of 2 or more. In, for example, the read operation BR2, the difference between the number of bits "1" of the data "2nd_B" and the number of bits "1" of the data "1st_B" is calculated. FIG. 11 shows this state.

As shown in FIG. 11, the operation shown in FIG. 9 corresponds to reading data while changing the read voltage VCGRV near the cross point between the threshold distributions of the "A" state and the "B" state. Then, the difference is minimized at the voltage VCGRV corresponding to the cross point. In this example, the voltage is VBm.

In the read operation BR(m+1) next to the read operation BRm, it is found that the voltage VBm corresponds to the cross point. Hence, if it is found that the voltage VBm corresponds to the cross point, the sequencer 170 ends the read operation BR. At this time, the latch circuit DL0 holds the data "(m+1)th_B", the latch circuit DL1 holds the data "mth_B", and the latch circuit DL2 holds data the "(m−1) th_B", as shown in FIG. 10. The sequencer 170 transmits the one page data "mth_B" obtained by the read operation BRm to the controller 200 as hard bit data.

<Soft Bit Reading>

Figure 12:
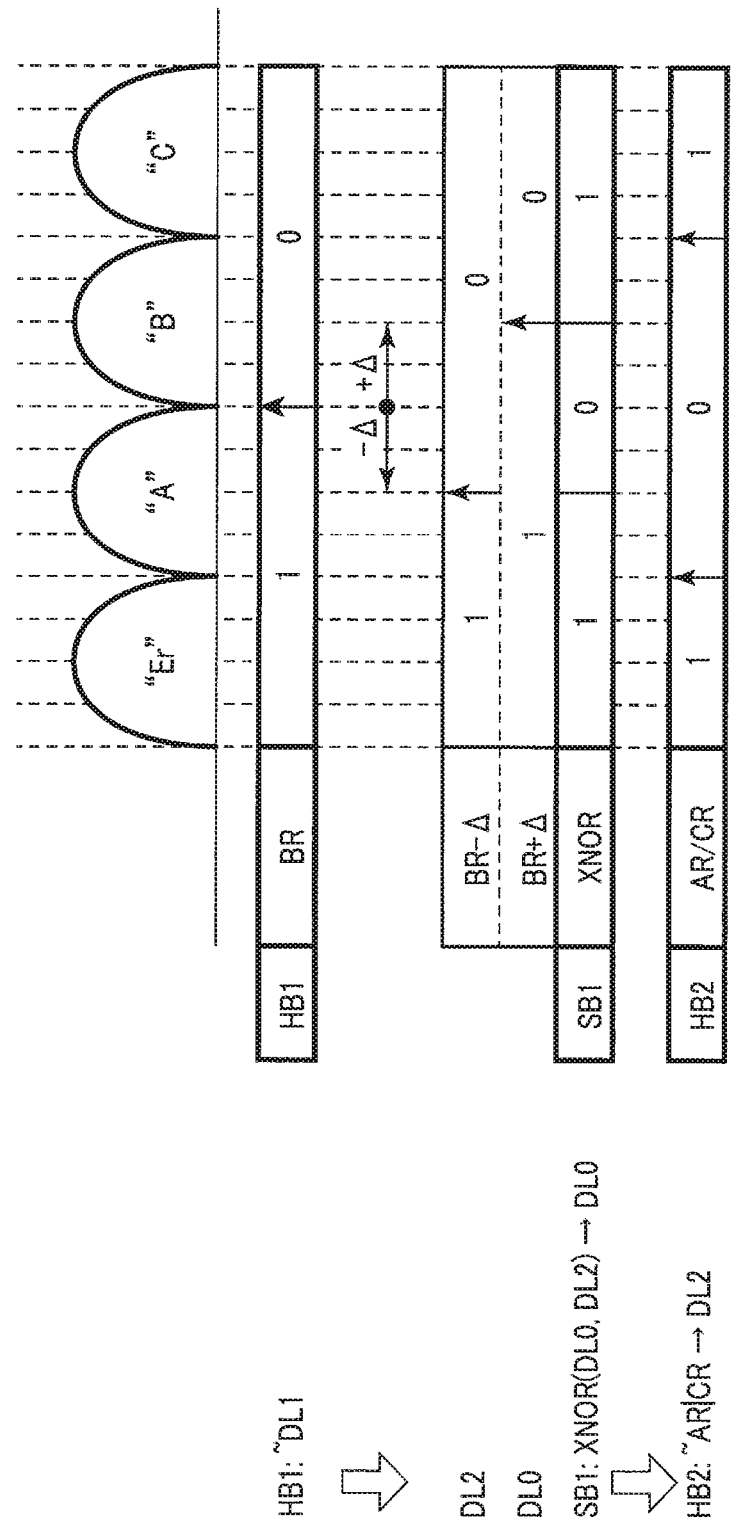
FIG. 12 is a schematic view of the threshold distributions of the memory cell and the latch circuits showing a soft decision operation according to the first embodiment.

The operation described concerning step S20 FIG. 6, which performed when soft bit data is requested, will be explained next. FIG. 12 shows data in the latch circuits DL0 to DL2 corresponding to the memory cell transistors in the "Er" state, the "A" state, the "B" state, and the "C" state, and shows the states of operations performed in the sense unit SAU to obtain the soft bit SB. Note that in FIG. 12, "~" represents inversion, and "|" represents an OR operation.

As shown in FIG. 12, the latch circuit DL1 holds the data "mth_B" read by the voltage VBm corresponding to the cross point between the threshold distributions, that is, the hard bit HB (this hard bit will be referred to as HB1 to discriminate it from other hard bits to be described later). That is, "1" is held by the latch circuit DL1 corresponding to the memory cell transistor MT whose threshold is less than the voltage VBm, and "0" is held by the latch circuit DL1 corresponding to the memory cell transistor MT whose threshold is equal to or more than the voltage VBm. However, when soft bit read is performed, it means that data cannot be corrected by hard decision decoding. Hence, an error probably exists near the cross point between the threshold distributions in the "A" state and the "B" state.

Next, when receiving the commands "XXh" and "YYh" described with reference to FIG. 8, the sense unit SAU executes processing using data obtained by read voltages on the negative and positive sides of VBm. However, in lower page reading, particular processing is unnecessary. Note that a decreasing width (−Δ) and an increasing width (+Δ) from the voltage VBm may appropriately be selected. In this example, the widths are defined as, for example, a step-up width ΔVB of the read voltage VCGRV.

A read result (this will be referred to as "BR−Δ") on the negative side is held by the latch circuit DL2. That is, "1" is held by the latch circuit DL2 corresponding to the memory cell transistor MT having the threshold on the low voltage side, and "0" is held by the latch circuit DL2 corresponding to the memory cell transistor MT having the threshold on the high voltage side, with respect to the voltage VB(m−1) serving as the boundary.

On the other hand, a read result (this will be referred to as "BR+Δ") on the positive side is held by the latch circuit DL1. That is, "1" is held by the latch circuit DL1 corresponding to the memory cell transistor MT having the threshold on the low voltage side, and "0" is held by the latch circuit DL1 corresponding to the memory cell transistor MT having the threshold on the high voltage side, with respect to the voltage VB(m+1) serving as the boundary.

When receiving the command "ZZh", in each sense unit SAU, for example, the operation unit OP performs the XNOR operation of (BR−Δ) and (BR+Δ) and causes the latch circuit DL0 to hold the operation result. This result is a soft bit SB1. Soft bit SB1="1" represents that the reliability of the corresponding hard bit HB1 is high, and soft bit SB1="0" represents that the reliability is low. That is, as can be seen from the example of FIG. 12, the reliability of the hard bit HB1 of the memory cell transistor whose threshold ranges from VB(m−1) to VB(m+1) with respect to the voltage VBm as the center is low. The column control circuit 140 transmits the soft bit SB1 of one page held by the latch circuit DL0 to the controller 200.

At a certain timing, upper page reading is performed. In each sense unit SAU, an OR operation of the inverted value of the result of the read operation AR and the result of the read operation CR is performed, and the operation result is held by the latch circuit DL2. The operation result held by the latch circuit DL2 is transmitted to the controller 200 as a hard bit HB2.

That is, the latch circuits DL0 to DL2 finally hold the soft bit SB1, the hard bit HB1, and the hard bit HB2, respectively, as shown in FIG. 13, and these data items are transmitted to the controller 200. Note that the hard bit HB2 may be used for soft bit decoding. An example will be described in the second embodiment.

1.2.4.2 Upper Page Reading

A case in which an upper page is read will be described next.

<Hard Bit Reading>

First, hard bit reading will be described with reference to FIG. 14. FIG. 14 is a timing chart of the selected word line WL, the node SEN, and the signal STB when an upper page is read in step S11 of FIG. 6. FIG. 14 shows the read operations AR and CR.

As shown in FIG. 14, the row decoder 120 steps up the value of the read voltage VCGRV a plurality of times, as in FIG. 9. In the example of FIG. 14, the read voltage VCGRV is stepped up (m+3) times from a voltage VA1 to VA(m+3) in the read operation AR, and the read voltage VCGRV is stepped up (n+3) times from a voltage VC1 to VC(n+3) in the read operation CR, where n is a natural number of 2 or more, and may be equal to or different from m. Read operations using the voltages VA1 to VA(m+3) will be referred to as read operations AR1 to AR(m+3), respectively, and read operations using the voltages VC1 to VC(n+3) will be referred to as read operations CR1 to CR(n+3), respectively, hereinafter.

The rest of the operation is the same as described with reference to FIG. 9. In each of the read operations AR1 to AR(m+3), the signal STB is asserted to strobe data. After that, the bit line BL is precharged again, and in each of the read operations CR1 to CR(n+3), the signal STB is asserted to strobe data.

FIG. 15 is a schematic view showing the latch circuits DL0 to DL5 in the sense unit SAU when performing the operation shown in FIG. 14. FIG. 15 shows the read operation AR. In the read operation AR, the three latch circuits DL0 to DL2 are used as in the read operation BR.

As shown in FIG. 15, data "1st_A" read by the read operation AR1 is first held by the latch circuit DL0. Next, when the read operation AR2 is executed, the data "1st_A" in the latch circuit DL0 is transferred to the latch circuit DL1, and data "2nd_A" read by the read operation AR2 is held by the latch circuit DL0.

Subsequently, as in the read operation BR, the read operation is executed up to the read operation AR(m+1), and a read voltage VAm is detected, which corresponds to the cross point between the threshold distributions of the "Er" state and the "A" state. At this time, the latch circuit DL0 holds data "(m+1)th_A", the latch circuit DL1 holds data "mth_A", and the latch circuit DL2 holds data "(m−1)th_A".

Next, the read operation CR is executed. FIG. 16 is a schematic view showing the latch circuits DL0 to DL5 in the sense unit SAU. FIG. 16 shows the read operation CR. At the point of time of execution of the read operation CR, the latch circuits DL0 to DL2 already hold the results of the read operations AR. Hence, the latch circuits DL3 to DL5 are used.

As shown in FIG. 16, during the read operation CR, the latch circuits DL0 to DL2 continuously hold the results of the read operations AR described with reference to FIG. 15. Data "1st_C" read by the read operation CR1 is first held by the latch circuit DL3. When the read operation CR2 is executed next, the data "1st_C" in the latch circuit DL3 is transferred to the latch circuit DL4, and data "2nd_C" read by the read operation CR2 is held by the latch circuit DL3.

In this way, data read every time the voltage of the selected word line WL is stepped up is first held by the latch circuit DL3 and then transferred in the order of the latch circuits DL4 and DL5. Hence, all the latch circuits DL3 to DL5 are used in the third read operation CR3. From the fourth read operation CR4, the oldest data at that point of time is discarded.

Assume that the difference between the numbers of on-bits is minimized for a voltage VBn. That is, assume that the voltage VBn is detected, which corresponds to the cross point between the threshold distributions of the "B" state and the "C" state. Then, the read operation CR ends at this point of time (read operation CR(n+1)). The latch circuit DL3 holds data "(n+1)th_C", the latch circuit DL4 holds the data "nth_C", and the latch circuit DL5 holds data the "(n−1)th_C".

The operation unit OP performs the OR operation of the data in the latch circuits DL1 and DL4, and stores the operation result as the hard bit HB1 in the latch circuit DL1. After that, the sequencer 170 transmits the data (the OR operation result of the inverted value of "mth_A" and "nth_C") of one page held by the latch circuit DL1 to the controller 200.

<Soft Bit Reading>

Figure 17:
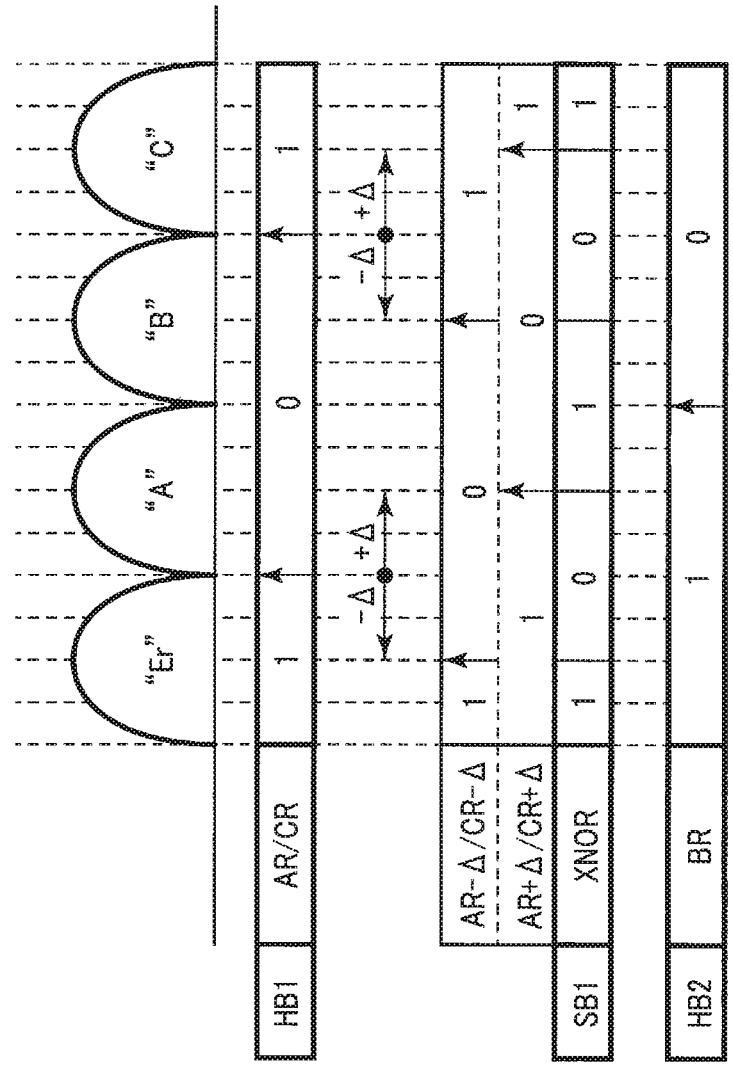
FIG. 17 is a schematic view of the threshold distributions of the memory cell and the latch circuits showing the soft decision operation according to the first embodiment.

Soft bit reading will be described next with reference to FIG. 17. FIG. 17 shows data in the latch circuits DL0 to DL2 corresponding to the memory cell transistors in the "Er" state, the "A" state, the "B" state, and the "C" state, and shows the operations performed in the sense unit SAU to obtain the soft bit SB.

As shown in FIG. 17, the latch circuit DL1 holds the hard bit HB1 based on the data "mth_A" and "nth_C" read by the voltages VAm and VCn corresponding to the cross point between the threshold distributions. That is, "1" is held by the latch circuit DL1 corresponding to the memory cell transistor MT whose threshold is lower than the voltage VAm, "0" is held by the latch circuit DL1 corresponding to the memory cell transistor MT whose threshold is equal to or higher than the voltage VAm and lower than VCn, and "1" is held by the latch circuit DL1 corresponding to the memory cell transistor MT whose threshold is equal to or higher than the voltage VCn. However, an error probably exists near the cross point between the threshold distributions in the "Er" state and the "A" state, and/or near the cross point between the threshold distributions in the "B" state and the "C" state.

Next, when receiving the commands "XXh" and "YYh" described with reference to FIG. 8, the sense unit SAU executes processing using data obtained by read voltages on the negative and positive sides of VAm and VCn.

First, as the processing of the read result on the negative side, the operation unit OP performs the OR operation of (AR−Δ) and (CR−Δ). In this example as well, an example in which Δ is the step-up width of the voltage VCGRV will be described. That is, this operation is the OR operation of "(m−1)th_A" and "(n−1)th_C". As the result of this operation, "1" is held by the latch circuit DL2 corresponding to the memory cell transistor MT having a threshold lower than VA(m−1), "0" is held by the latch circuit DL2 corresponding to the memory cell transistor MT whose threshold is equal to or higher than the voltage VA(m−1) and lower than VC(n−1), and "1" is held by the latch circuit DL2 corresponding to the memory cell transistor MT having a threshold equal to or higher than VC(n−1).

Next, as the processing of the read result on the positive side, the operation unit OP performs the OR operation of (AR+Δ) and (CR+Δ). That is, this operation is the OR operation of "(m+1)th_A" and "(n+1)th_C". As the result of this operation, "1" is held by the latch circuit DL0 corresponding to the memory cell transistor MT having a threshold lower than VA(m+1), "0" is held by the latch circuit DL0 corresponding to the memory cell transistor MT whose is equal to or higher than the voltage VA(m+1) and lower than VC(n+1), and "1" is held by the latch circuit DL0 corresponding to the memory cell transistor MT having a threshold equal to or higher than VC(n+1).

When receiving the command "ZZh", in each sense unit SAU, for example, the operation unit OP performs the XNOR operation of the data held by the latch circuit DL0 and the data held by the latch circuit DL2 and causes the latch circuit DL0 to hold the result. This result is the soft bit SB1. As can be seen from the example of FIG. 17, the reliability of the hard bits of the memory cell transistors whose thresholds range from VA(m−1) to VA(m+1) with respect to the voltage VAm as the center and the memory cell transistors whose thresholds range from VC(n−1) to VC(n+1) with respect to the voltage VCn as the center is low. The column control circuit 140 transmits the soft bit SB1 of one page held by the latch circuit DL0 to the controller 200.

At a certain timing, lower page reading is performed. In each sense unit SAU, the inverted value of the result of the read operation BR is held by the latch circuit DL2. The operation result held by the latch circuit DL2 is transmitted to the controller 200 as, for example, the hard bit HB2.

Hence, the data described above with reference to FIG. 13 are finally held by the latch circuits DL0 to DL2.

1.3 Effects According to this Embodiment

According to the arrangement of this embodiment, it is possible to improve the read speed. This effect will be described below.

In this embodiment, data is read from the memory cell array 110 to the sense amplifier SA using a plurality of read voltages VCGRV, thereby searching for the cross point between adjacent threshold distributions (see FIGS. 9, 10, and 14 to 16). Then, data read using the read voltage VCGRV (optimal read level) corresponding to the cross point is output to the controller 200 as hard bit data.

At this time, at least some of data items read by voltages other than the optimal read level are held by the latch circuits DL in the sense unit SAU without being discarded. If hard bit decoding is failed, and soft bit decoding is required, the NAND flash memory 100 generates soft bit data using the data left in the latch circuits DL in the sense unit SAU.

That is, when performing soft bit decoding, the data need not be read from the memory cell array 110 again. That is, applying voltage by the row decoder 120 and the sense operation of the sense amplifier SA are unnecessary, and it is only necessary to read data from the latch circuits DL. It is therefore possible to shorten the time needed for the read operation and reduce power consumption.

2. Second Embodiment

A memory system according to the second embodiment will be described next. In this embodiment, the read method described in the first embodiment is applied to a case in which a memory cell holds 3-bit data, and a read voltage VCGRV temporally continuously changes. Only points different from the first embodiment will be described below.

2.1 Data Read Operation

The read operation of the memory system according to this embodiment will be described.

2.1.1 Held Data and Threshold Voltage of Memory Cell Transistor

The held data, threshold voltage, and data read levels of a memory cell transistor MT will be described first with reference to FIG. 18. FIG. 18 is a diagram showing data and threshold distributions that each memory cell transistor MT can take, threshold distributions, and voltages used in data reading.

As described above, the memory cell transistor MT can hold 3 bits, that is, eight states in accordance with the threshold voltage. The eight states will be referred to as an "Er" state, "A" state, "B" state, "C" state, . . . , and "G" state in ascending order of threshold voltage.

The "Er" to "B" states are the same as described with reference to FIG. 5. The threshold voltage of the memory cell transistor MT in the "C" state is equal to or higher than a voltage VC and lower than a voltage VD (<VC). The threshold voltage of the memory cell transistor MT in the "D" state is equal to or higher than a voltage VD and lower than a voltage VE (<VD). The threshold voltage of the memory cell transistor MT in the "E" state is equal to or higher than the voltage VE and lower than a voltage VF (>VE). The threshold voltage of the memory cell transistor MT in the "F" state is equal to or higher than the voltage VF and lower than a voltage VG (>VF). The threshold voltage of the memory cell transistor MT in the "G" state is equal to or higher than the voltage VG and lower than a voltage VREAD.

The above-described threshold distributions are implemented by writing the 3-bit (3-page) data including a lower bit, a middle bit, and an upper bit. That is, the "Er" state to the "G" state and the lower bit, the middle bit, and the upper bit hold the following relationship.

"Er" state: "111" (the bits are arranged in the order of "upper/middle/lower")
"A" state: "110"
"B" state: "100"
"C" state: "000"
"D" state: "010"
"E" state: "011"
"F" state: "001"
"G" state: "101"

Between data corresponding to two adjacent states in the threshold distributions, only one of the three bits changes.

Hence, when reading the lower bit, a voltage corresponding to the boundary where the value ("0" or "1") of the lower bit changes is used. This also applies to the middle bit and the upper bit.

That is, as shown in FIG. 18, lower page reading includes read operations AR and ER. In the read operation ER, the voltage VE is used as the read level, thereby making discrimination between the "D" state and the "E" state.

Middle page reading includes read operations BR, DR, and FR. In the read operation DR, the voltage VD is used as the read level, thereby making discrimination between the "C" state and the "D" state. In the read operation FR, the voltage VF is used as the read level, thereby making discrimination between the "E" state and the "F" state.

Upper page reading includes read operations CR and GR. In the read operation GR, the voltage VG is used as the read level, thereby making discrimination between the "F" state and the "G" state.

2.1.2 Read Voltage and Strobe Timing

Figure 19:
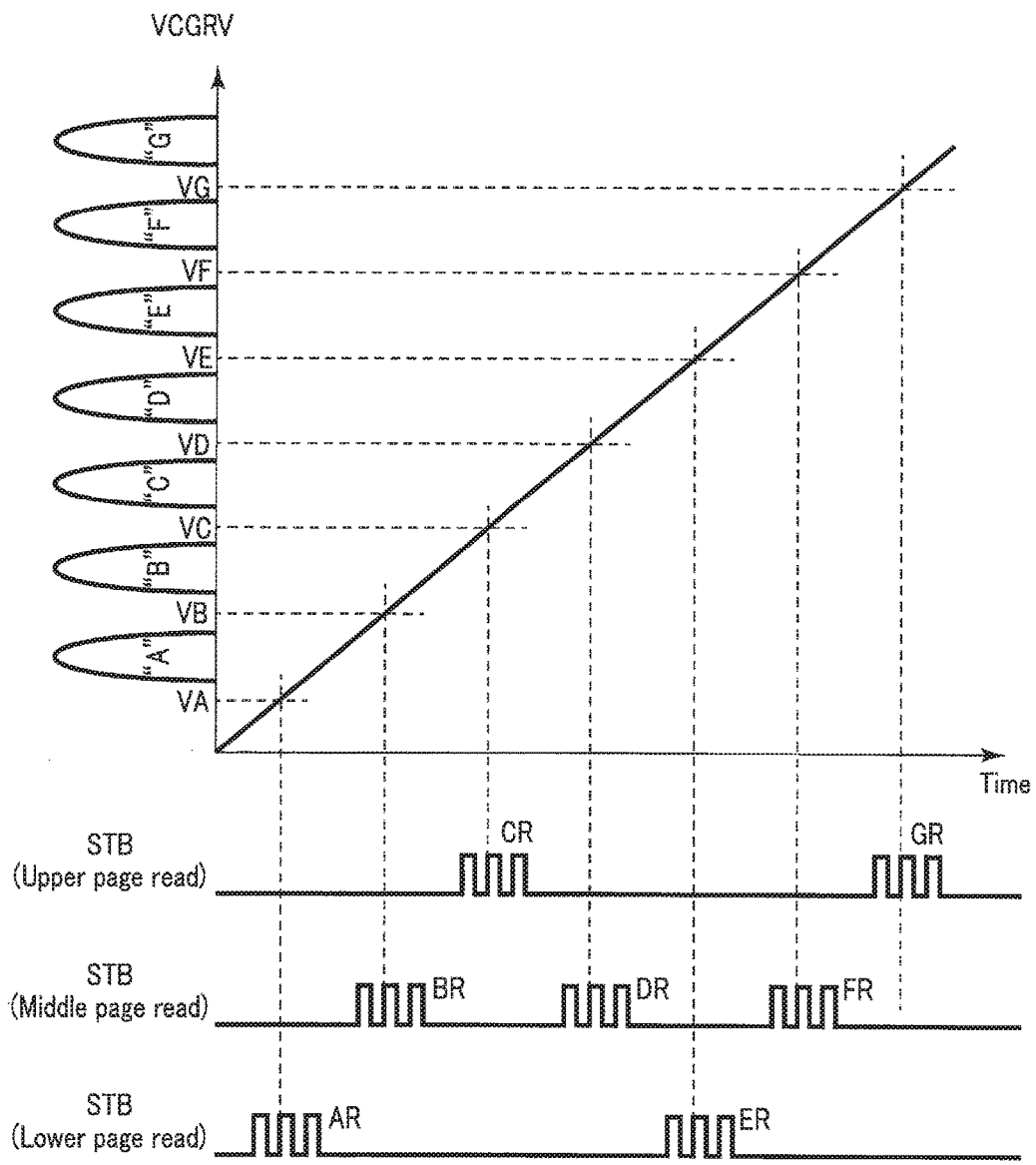
FIG. 19 is a graph showing a time-rate change in a voltage applied to a selected word line and a strobe timing in a read operation according to the second embodiment.

The read voltage VCGRV applied to a selected word line WL and a data strobe timing will be described next with reference to FIG. 19. FIG. 19 shows a graph showing a time-rate change in the voltage VCGRV and a timing chart of a signal STB.

As shown in FIG. 19, the voltage VCGRV does not rise stepwise, as in the first embodiment, but rises continuously with time. Note that "continuously with time" does not exclude a case in which the voltage is stepped up but also includes a case in which the voltage is stepped up a plurality of times during a period in which, for example, the signal STB is asserted. That is, a case in which the voltage is stepped up in a small step at a short time interval is also included.

In the upper page reading, when the voltage VCGRV reaches a value near the voltage VC or VG, the signal STB is asserted a plurality of times. FIG. 19 shows an example in which the signal STB is asserted three times in each of the read operations CR and GR. However, this is merely an example, and the number of times is not limited to three times. In the middle page reading, when the voltage VCGRV reaches a value near the voltage VB, VD, or VF, the signal STB is asserted a plurality of times. In the lower page reading, when the voltage VCGRV reaches a value near the voltage VA or VE, the signal STB is asserted a plurality of times.

2.1.3 Details of Operation of NAND Flash Memory

Details of the operation of a NAND flash memory 100 in the data read operation will be described next. The overall procedure and the command sequence of the read operation are the same as in the first embodiment, and a description thereof will be omitted. Note that each sense unit SAU according to this embodiment includes 14 latch circuits DL0 to DL13 in addition to an latch circuit XDL.

2.1.3.1 Lower Page Reading

A case in which a lower page is read will be described first.

<Hard Bit Reading>

Hard bit reading is the same as in FIGS. 9 to 11 described in the first embodiment. Unlike the first embodiment, in each of the read operations AR and ER, seven latch circuits are used, and the latch circuits are caused to hold data read using three types of voltages on the high voltage side and three types of voltages on the low voltage side with respect to a voltage corresponding to the cross point between threshold distributions.

Figure 20:
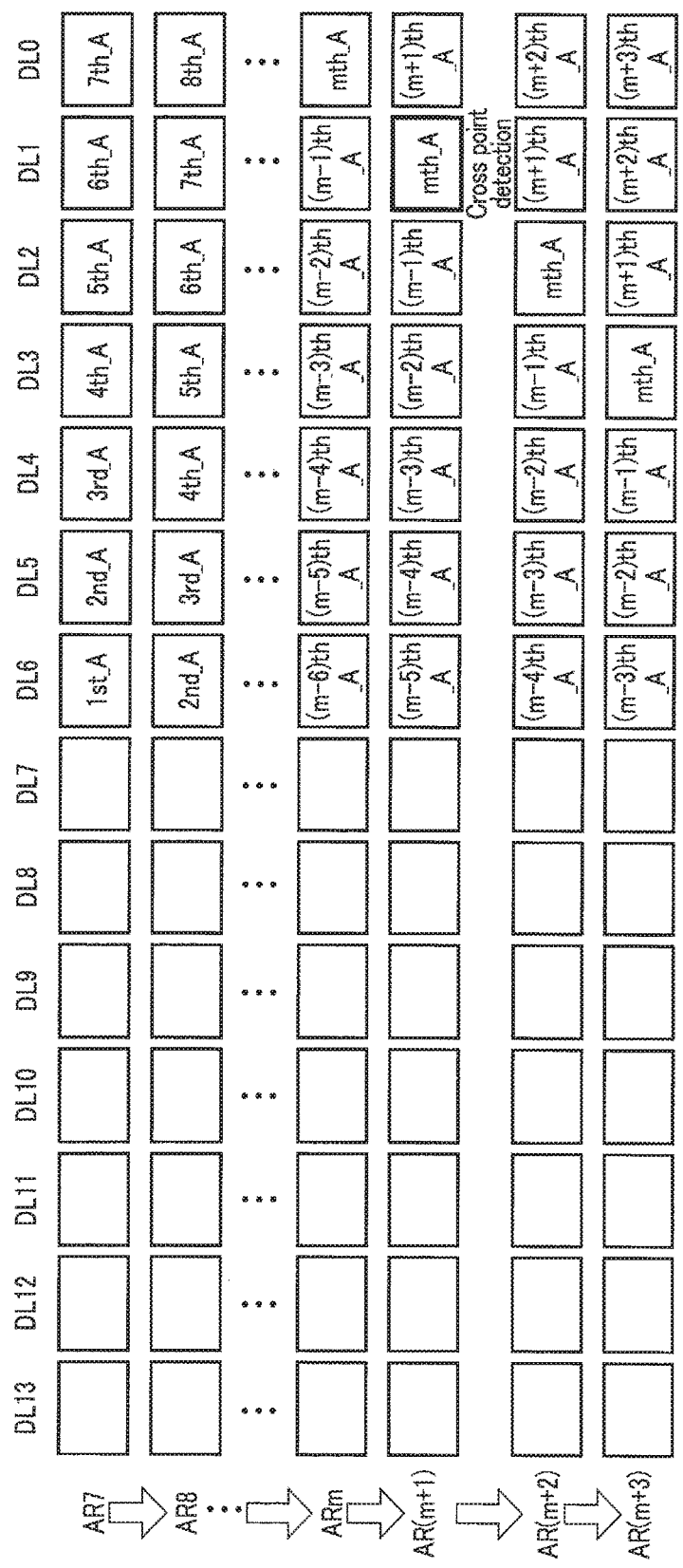
FIGS. 20 to 25 are schematic views of latch circuits in the read operation according to the second embodiment.

FIG. 20 is a schematic view showing the states of the latch circuits DL0 to DL13 at the read operation AR. In the read operation AR, the latch circuits DL0 to DL6 are used.

As shown in FIG. 20, all the latch circuits DL0 to DL6 are in a use state in a seventh read operation AR7. Hence, from a read operation AR8, data held by the latch circuit DL6 until immediately before the read operation AR8 is executed is discarded.

In a read operation AR(m+1), it is detected that a voltage VAm corresponds to the cross point between the threshold distributions of the "Er" state and the "A" state. However, even after that, data is strobed at timings at which the value of the voltage VCGRV reaches VA(m+2) and VA(m+3), and the read operation AR is executed (m+3) times.

As a result, the latch circuits DL0 to DL6 hold "(m+3)th_A", "(m+2)th_A", "(m+1)th_A", "mth_A", "(m−1)

th_A", "(m−2)th_A", and "(m−3)th_A", respectively. That is, the data read using voltages of ±Δ, ±2Δ, and ±3Δ with respect to the optimal read voltage VAm are held by the latch circuits DL0 to DL2 and DL4 to DL6.

Figure 21:
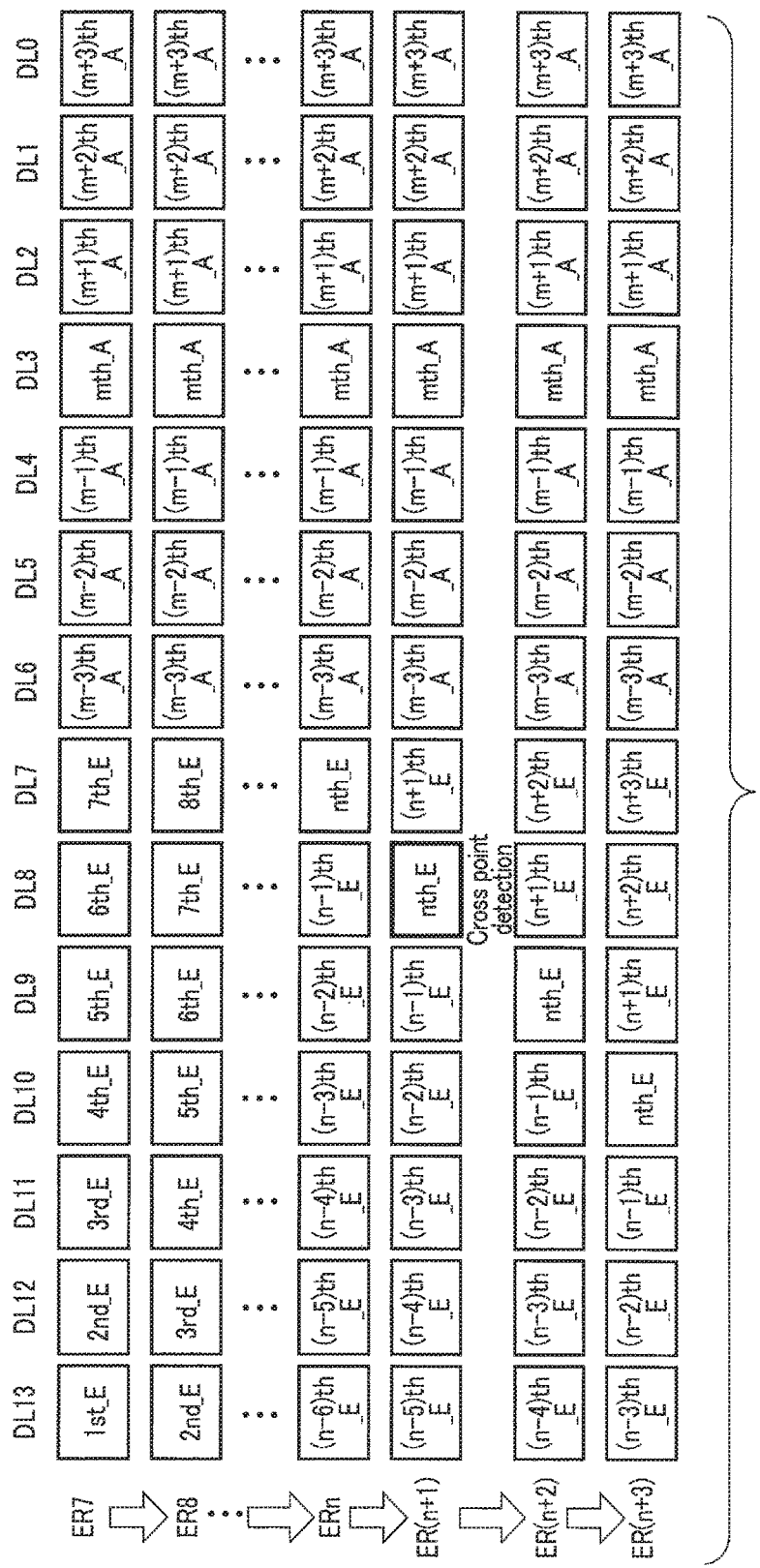

Next, the read operation ER is executed. FIG. 21 is a schematic view showing the states of the latch circuits DL0 to DL13 at the read operation ER. At the point of time of execution of the read operation ER, the latch circuits DL0 to DL6 already hold the results of the read operations AR. Hence, the latch circuits DL7 to DL13 are used.

As shown in FIG. 21, during execution of the read operation ER, the latch circuits DL0 to DL6 continuously hold the results of the read operations AR described with reference to FIG. 20. Data "1st_E" read by a read operation ER1 is first held by the latch circuit DL7. When a read operation ER2 is executed next, the data "1st_E" in the latch circuit DL7 is transferred to the latch circuit DL8, and data "2nd_E" read by the read operation ER2 is held by the latch circuit DL7.

In this way, data read every time the voltage of the selected word line WL rises is first held by the latch circuit DL7 and then transferred in the order of the latch circuits DL8, DL9, . . . , DL13. Hence, all the latch circuits DL7 to DL13 are used in a read operation ER7. From a read operation ER8, the oldest data at that time, that is, the data held by the latch circuit DL13 until immediately before the read operation ER8 is executed is discarded, and the same applies to subsequent reading.

In a read operation ER(n+1), it is detected that a voltage VEn corresponds to the cross point between the threshold distributions of the "D" state and the "E" state. However, in the read operation ER, two more read operations ER(n+2) and ER(n+3) are executed, as in the read operation AR. As a result, the latch circuits DL8 to DL13 hold "(n+3)th_E", "(n+2)th_E", "(n+1)th_E", "nth_E", "(n−1)th_E", "(n−2)th_E", and "(n−3)th_E", respectively.

An operation unit OP performs the OR operation of the data in the latch circuits DL3 and DL8, and stores the operation result as hard bit HB1 in the latch circuit DL3. After that, a sequencer 170 transmits the data (the OR operation result of the inverted value of "mth_A" and "nth_C") of one page held by the latch circuit DL3 to a controller 200.

<Soft Bit Reading>

Soft bit reading will be described next with reference to FIGS. 22 to 26. FIGS. 22 to 26 show the latch circuits DL0 to DL13 at the soft bit reading. FIG. 26 shows data in the latch circuits DL0 to DL13 corresponding to memory cell transistors in the "Er" to "G" states and shows the states of operations performed in the sense unit SAU to obtain the soft bit SB.

Figure 22:
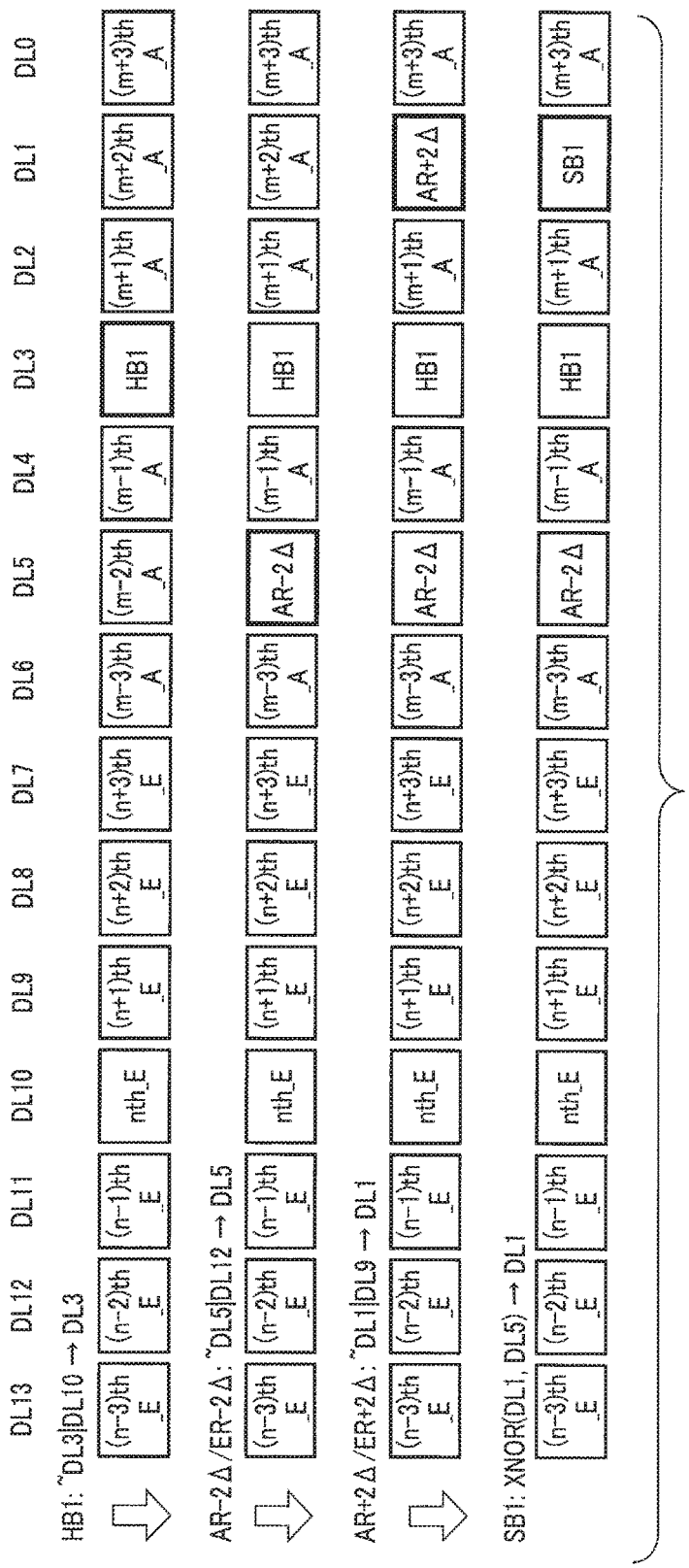

As shown in FIGS. 22 and 26, the OR operation result (hard bit HB1) of the inverted data of the latch circuit DL13 and the data in the latch circuit DL10 is held by the latch circuit DL3. In the hard bit HB1, the value of the bit corresponding to the memory cell transistor MT whose threshold is lower than VAm is "1", the value of the bit corresponding to the memory cell transistor MT whose threshold is equal to or higher than VAm and lower than VEn is "0", and the value of the bit corresponding to the memory cell transistor MT whose threshold is equal to or higher than VEn is "1", as shown in FIG. 26.

Next, the sense unit SAU executes processing using data obtained by read voltages of ±2Δ with respect to VAm and VEn.

First, as the processing of the read result on the negative side, the operation unit OP performs the OR operation of (AR−2Δ) and (ER−2Δ). As the result of this operation, "1" is held by the latch circuit DL5 corresponding to the memory cell transistor MT having a threshold lower than VA(m−2), "0" is held by the latch circuit DL5 corresponding to the memory cell transistor MT whose threshold is equal to or higher than the voltage VA(m−2) and lower than VE(n−2), and "1" is held by the latch circuit DL5 corresponding to the memory cell transistor MT having a threshold equal to or higher than VC(n−2).

Next, as the processing of the read result on the positive side, the operation unit OP performs the OR operation of (AR+2Δ) and (ER+2Δ). As the result of this operation, "1" is held by the latch circuit DL1 corresponding to the memory cell transistor MT having a threshold lower than VA(m+2), "0" is held by the latch circuit DL1 corresponding to the memory cell transistor MT whose threshold is equal to or higher than the voltage VA(m+2) and lower than VE(n+2), and "1" is held by the latch circuit DL1 corresponding to the memory cell transistor MT having a threshold equal to or higher than VE(n+2).

In each sense unit SAU, for example, the operation unit OP performs the XNOR operation of the data held by the latch circuit DL1 and the data held by the latch circuit DL5 and causes the latch circuit DL1 to hold the result. This result is a soft bit SB1. As can be seen from the example of FIG. 26, the reliability of the hard bits of the memory cell transistors whose thresholds range from VA(m−2) to VA(m+2) with respect to the voltage VAm as the center and the memory cell transistors whose thresholds range from VC(n−2) to VC(n+2) with respect to the voltage VEn as the center is low. The column control circuit 140 transmits the soft bit SB1 of one page held by the latch circuit DL0 to the controller 200.

Figure 23:
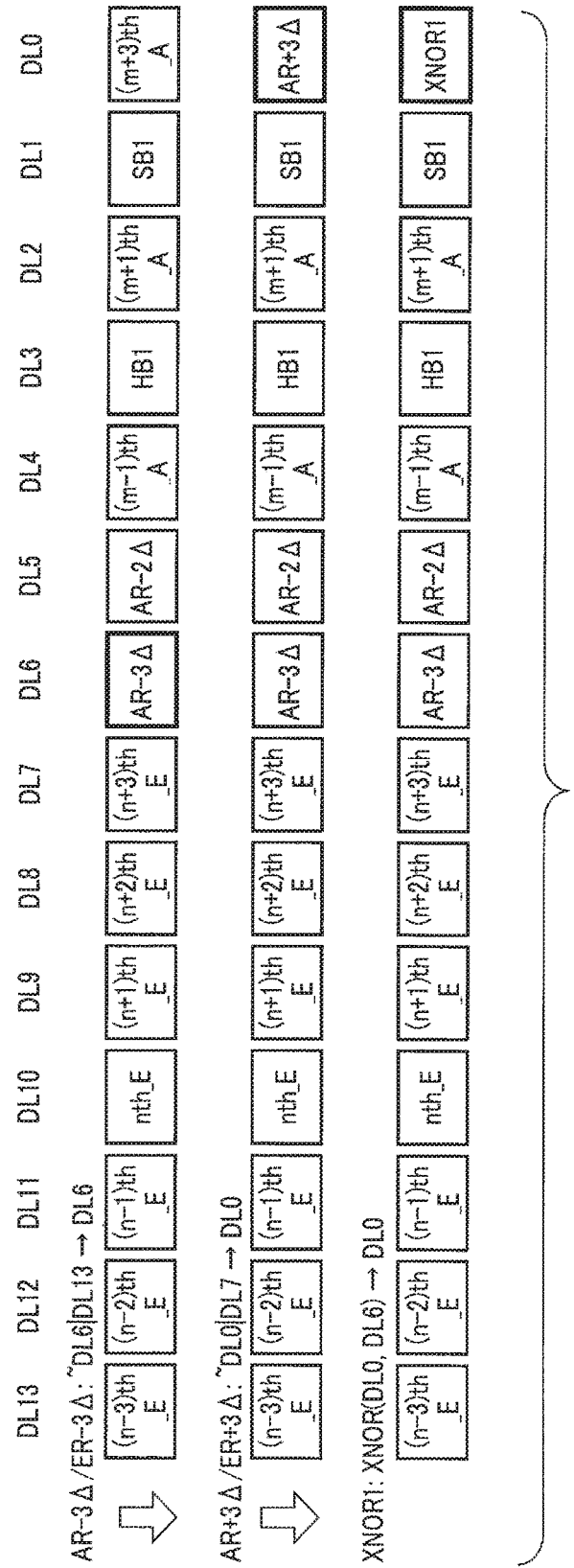

Next, in the same way as described above, the operation unit OP performs the OR operation of (AR−3Δ) and (ER−3Δ) and causes the latch circuit DL6 to hold the operation result, as shown in FIGS. 23 and 26. In addition, the operation unit OP performs the OR operation of (AR+3Δ) and (ER+3Δ) and causes the latch circuit DL0 to hold the operation result. In each sense unit SAU, for example, the operation unit OP performs the XNOR operation of the data held by the latch circuit DL0 and the data held by the latch circuit DL6 and causes the latch circuit DL0 to hold the result.

Figure 24:
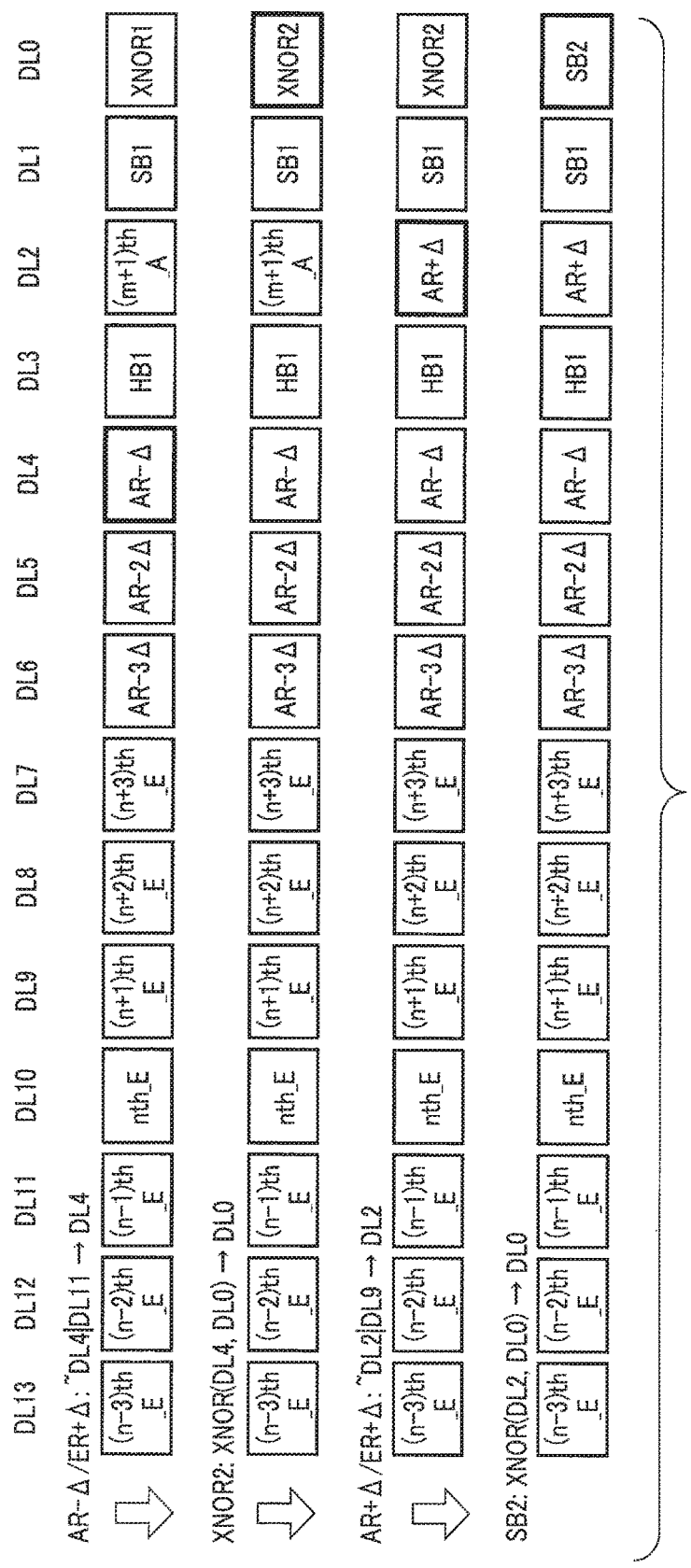

Next, the operation unit OP performs the OR operation of (AR−Δ) and (ER−Δ) and causes the latch circuit DL4 to hold the operation result, as shown in FIGS. 24 and 26. In addition, the operation unit OP performs the XNOR operation of the data in the latch circuit DL4 and the data in the latch circuit DL0 and causes the latch circuit DL0 to hold the result. Subsequently, the operation unit OP performs the OR operation of (AR+Δ) and (ER+Δ) and causes the latch circuit DL2 to hold the operation result.

Then, the operation unit OP performs the XNOR operation of the data in the latch circuit DL2 and the data in the latch circuit DL0 and causes the latch circuit DL0 to hold the result. This operation result is a soft bit SB2. As can be seen from the example of FIG. 26, the reliability of the hard bits of the memory cell transistors whose thresholds range from VA(m−1) to VA(m+1) with respect to the voltage VAm as the center and the memory cell transistors whose thresholds range from VC(n−1) to VC(n+1) with respect to the voltage VEn as the center is low. The column control circuit 140 transmits the soft bit SB2 of one page held by the latch circuit DL0 to the controller 200.

Figure 25:
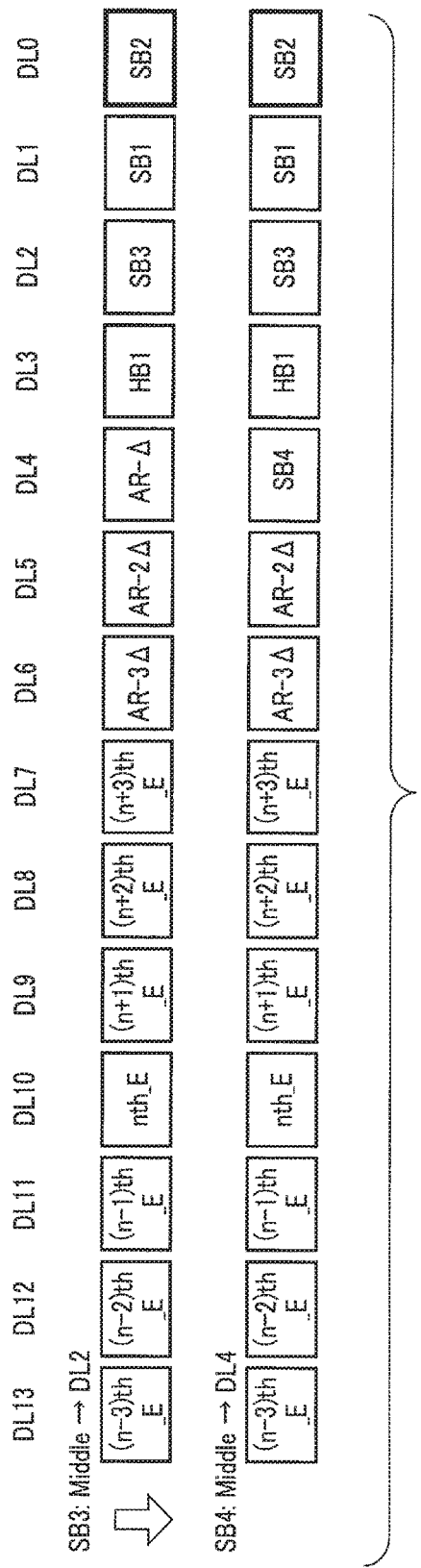
Figure 26:
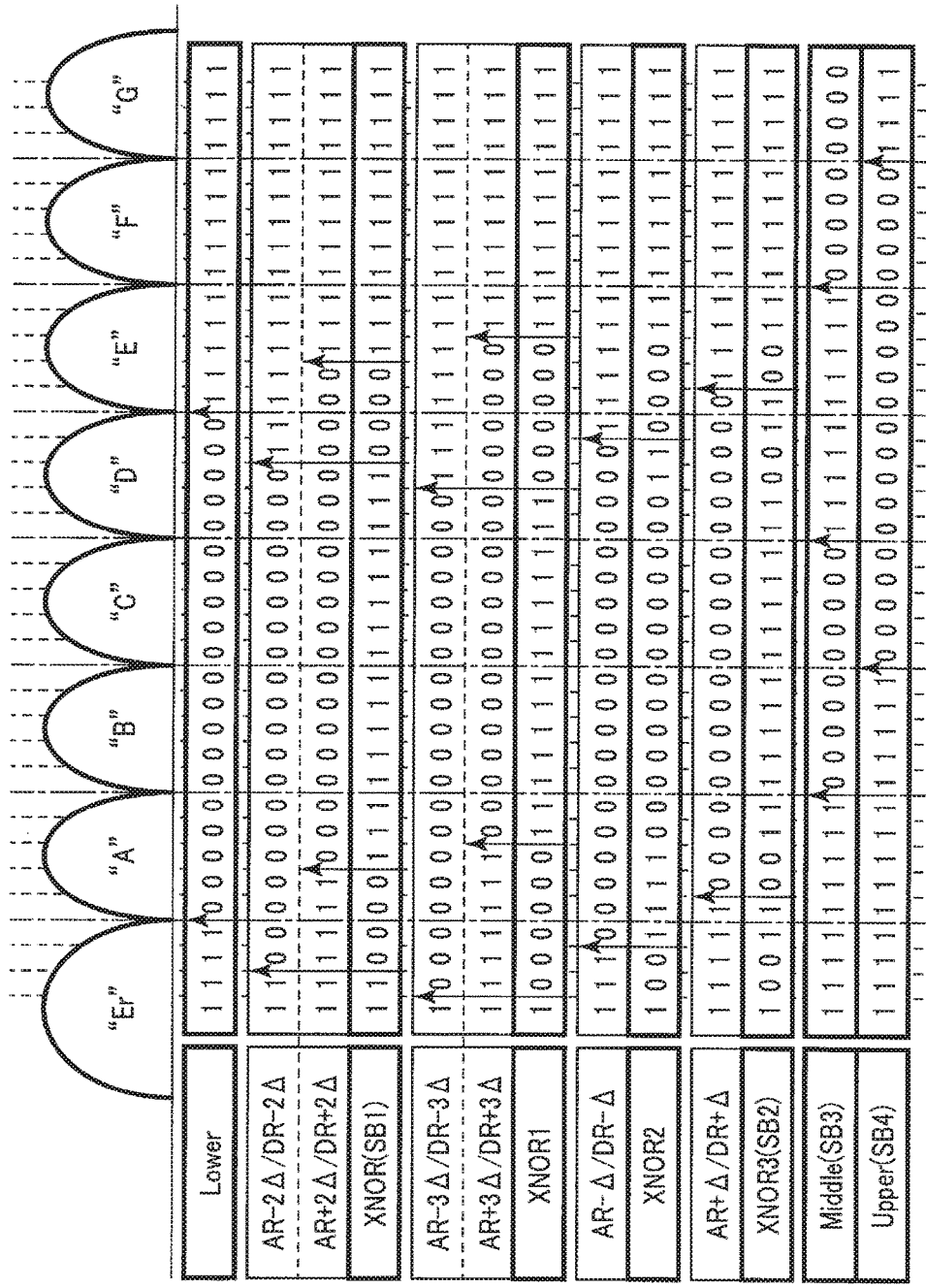
FIGS. 26 to 28 are schematic views of the threshold distributions of the memory cell and the latch circuits showing a soft decision operation according to the second embodiment.

At a certain timing, middle page reading and upper page reading are performed, and the results are held by the latch circuits DL2 and DL4, as shown in FIG. 25. These data items are transmitted to the controller 200 as soft bits SB3 and SB4.

2.1.3.2 Middle Page Reading and Upper Page Reading

Figure 27:
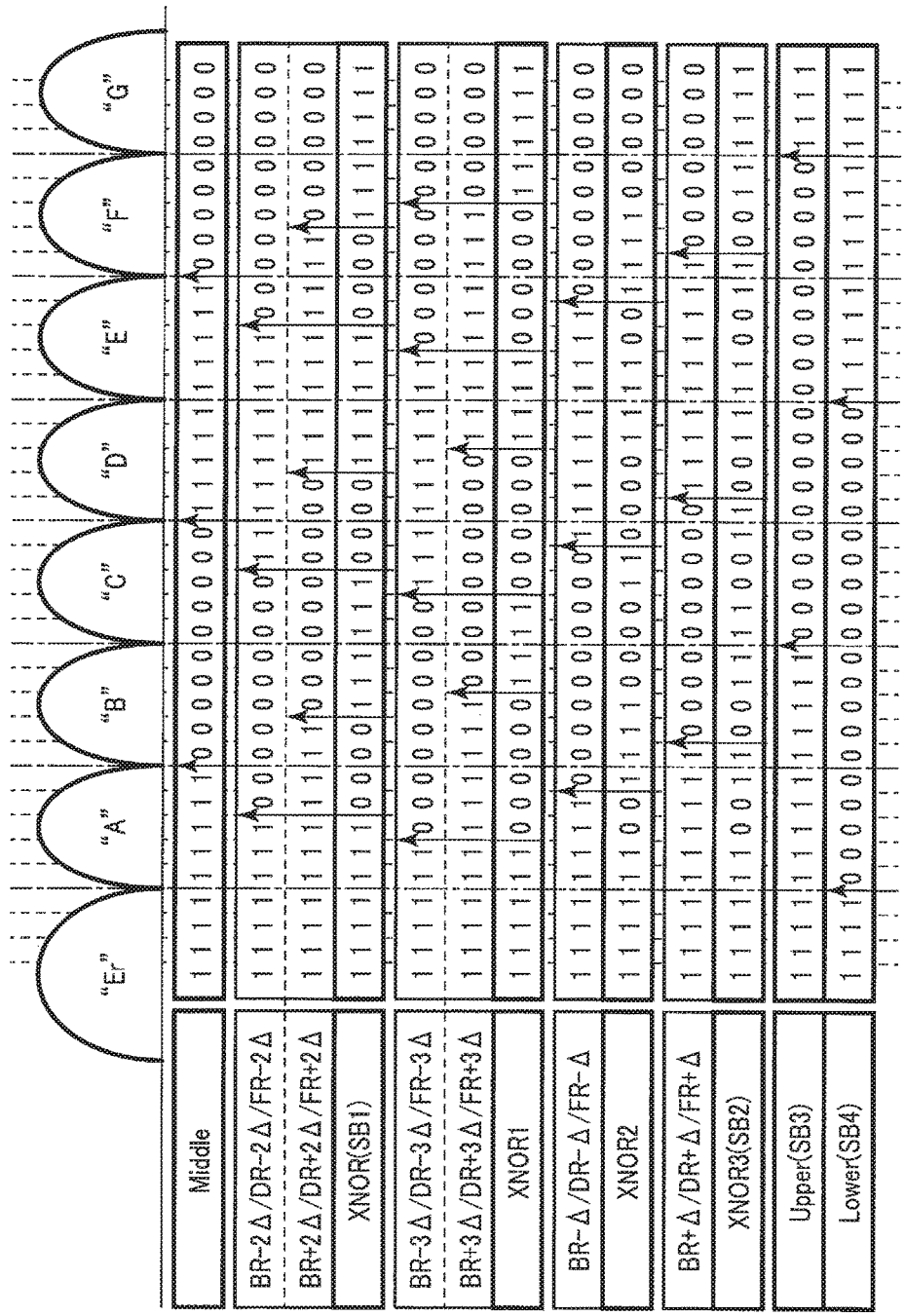
Figure 28:
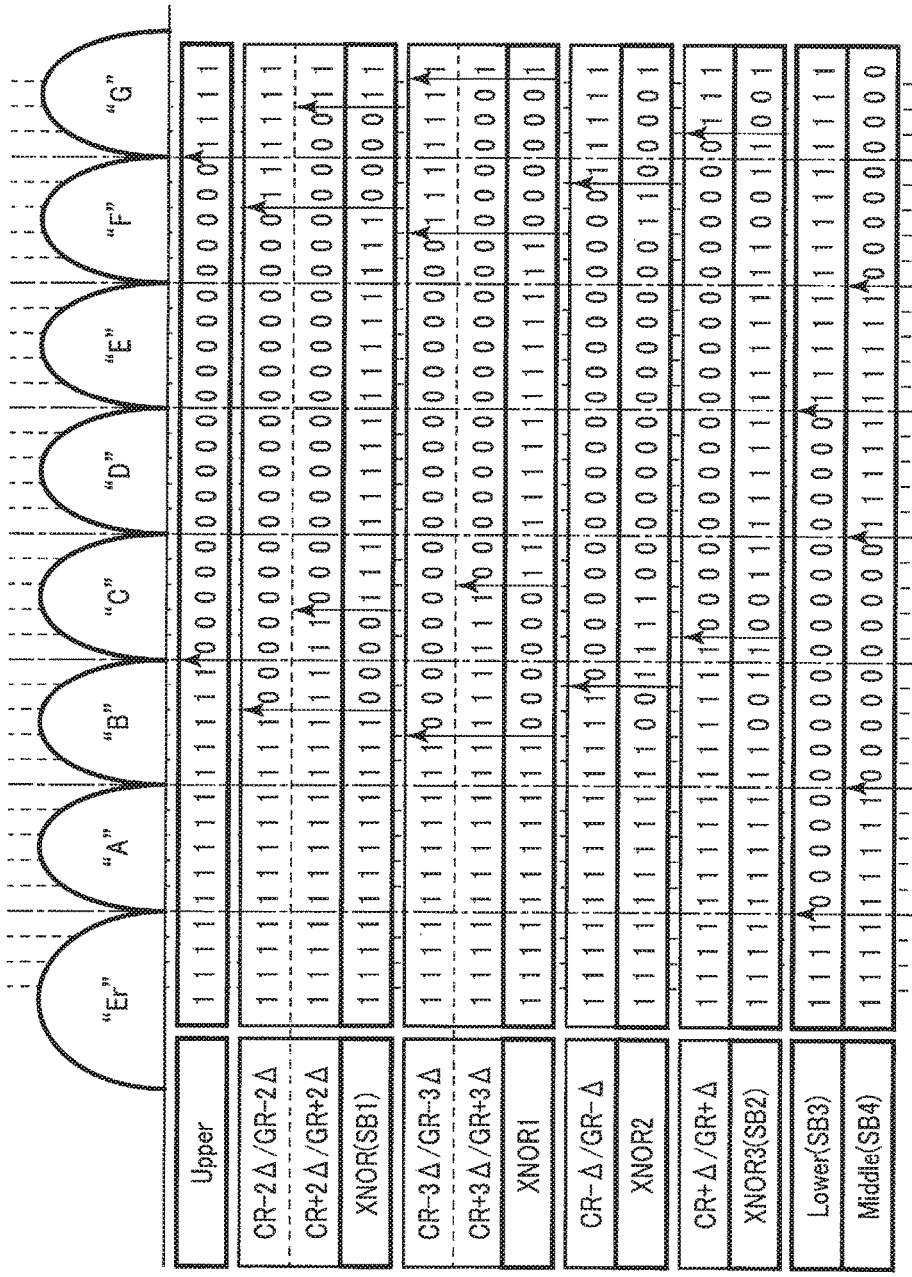

Middle page reading and upper page reading are performed in the same way as described above. Only soft bit read will briefly be described below. FIGS. 27 and 28 show data in the latch circuits DL0 to DL13 corresponding to memory cell transistors in the "Er" to "G" states and show operation methods for the middle page and the upper page, respectively.

Even if the read target is the middle page or upper page, the soft bits SB1 and SB2 are generated using data corresponding to $\pm\Delta$, $\pm2\Delta$, and $\pm3\Delta$ from the optimal read level detected at the hard bit reading, as in the lower page.

In the middle page, however, three read levels VB, VD, and VF are used. Hence, for example, the soft bit SB1 is calculated by the XNOR operation of the OR of (BR−2Δ), (DR−2Δ), and (FR−2Δ) and the OR of (BR+2Δ), (DR+2Δ), and (FR+2Δ).

2.2 Effects According to this Embodiment

As described above, the second embodiment is also applicable to a case in which the read voltage VCGRV changes continuously with time. The second embodiment is also applicable to a case in which a memory cell may hold data of 3 or more bits.

Additionally, according to this embodiment, the soft bits SB1 and SB2 are generated using data corresponding to $\pm\Delta$, $\pm2\Delta$, and $\pm3\Delta$ from the optimal read level. It is therefore possible to further increase the soft bit decoding capability of the ECC circuit 260.

That is, "0" of the soft bit SB1 indicates that the reliability of associated hard bit data is low in the example of FIG. 26. Hence, according to the soft bit SB1, the reliability of data read by the read operations AR(m−2), AR(m−1), AR(m+1), and AR(m+2) and the read operations ER(m−2), ER(m−1), ER(m+1), and ER(m+2) is low, as can be seen.

Furthermore, "1" of the soft bit SB2 indicates that the reliability of associated hard bit data is low. Hence, according to the soft bit SB2, the reliability of data particularly read by the read operations AR(m−1) and AR(m+1) and the read operations ER(m−1) and ER(m+1) is low, as can be seen.

In FIG. 26, each of the soft bits SB2 corresponding to the "B" state, the "C" state, the "F" state, or the like is "1". Since this region is apart from the read level, the reliability should be high. According to this embodiment, the hard bit information for the middle page and the upper page are used as the soft bits SB3 and SB4 to cause the ECC circuit 260 to recognize that the soft bit SB2 in that region does not have an effective value. That is, for example, in FIG. 26, the soft bit SB2 associated with the threshold levels of the "F" state and the "G" state is "1". However, when the soft bits SB3 and SB4 are referred to, it can be found that VF and VG are not the read levels of the lower page. That is, the reliability of hard bits whose threshold levels are the "F" state and the "G" state is high, and the ECC circuit 260 can determine that the soft bits SB2 in these region can be neglected.

It is difficult for the ECC circuit 260 to know, only by the bit string of the lower page, to which read level it corresponds. However, by referring to the soft bits SB3 and SB4, the ECC circuit 260 can recognize that the two read levels of the lower page are VA and VE. In particular, the threshold distribution of the "Er" state is known to readily largely shift to the high voltage side due to various kinds of disturbances, as compared to other threshold distributions. Hence, if it is found based on the soft bits SB3 and SB4 that an error exists in the data obtained by the read operation AR, it can be determined that a memory cell in the "Er" state contributes to the error bit more than a memory cell in the "A" state, and the error can be corrected.

As described above, the number of bits of the soft bit SB is increased, thereby the ECC circuit 260 can obtain many pieces of information, and it is possible to make the most of the error correction capability of the ECC circuit 260.

3. Modifications

As described above, a memory system according to the embodiment includes a semiconductor memory device (100 in FIG. 1) including a memory cell array and a latch circuit capable of holding data read from the memory cell array, and a controller (200 in FIG. 1) capable of issuing a first read instruction (00h-ADD-30h in FIG. 7) and a second read instruction (XXh, YYh, and ZZh in FIG. 8) different from the first read instruction. When receiving the first read instruction, the semiconductor memory device reads first data (HB) and second data ($\pm\Delta$) from the memory cell array, holds the first data and the second data in the latch circuit (FIG. 10), and outputs the first data (HB) to the controller (S11-S14 in FIG. 6). When receiving the second read instruction, the semiconductor memory device outputs third data (SB) based on the second data ($\pm\Delta$) held by the latch circuit to the controller (S19-S21 in FIGS. 6 and 12). The controller performs soft decision processing using the third data (SB) (S24 in FIG. 6).

With the above arrangement, the data read performance of the memory system can be improved.

Note that the above-described embodiments can variously be modified and are not limited to the first and second embodiments.

For example, the operation method using the latch circuits DL described in the first and second embodiments is merely an example. The method is not particularly limited as long as it can obtain the necessary soft bit SB. For example, an example in which the soft bit SB is calculated using the XNOR operation has been described in the embodiments. However, this method is merely an example, and any other logic operation may be used. The order of operations may also be changed as much as possible.

In the second embodiment, an example in which every time the soft bit SB is generated, the generated soft bit SB is transmitted to the controller 200 has been described. However, after the two soft bits SB1 and SB2 are obtained, they may be transmitted to the controller 200 together.

The command sequence described with reference to FIG. 8 may also appropriately be changed. In FIG. 8, an example in which the three commands "XXh", "YYh", and "ZZh" are issued has been described. However, for example, only "ZZh" may be issued. In this case, in response to "ZZh", the NAND flash memory 100 starts calculating the soft bit SB using data based on $\pm\Delta$.

The number of bits of the soft bit SB to be calculated can also appropriately be selected. When the number of bits of the soft bit SB is increased, the data correction capability may be improved. However, the number of latch circuits DL in the sense unit SAU increases. For this reason, the number of bits of the soft bit SB may be decided based on the relationship between the correction capability and the circuit area.

In the above embodiments, an example in which the memory cell transistor MT holds 2- or 3-bit data has been described. However, the memory cell transistor MT may hold data of four or more bits, as a matter of course.

Note that in each embodiment concerning the present invention, (1) the voltage applied to the selected word line in the read operation of A level may range from, for example, 0 V to 0.55 V. However, the present embodiments are not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the read operation of B level may range from, for example, 1.5 V to 2.3 V. However, the voltage is not limited to this and may be set within any one of the ranges of 1.65 V to 1.8 V, 1.8 V to 1.95 V, 1.95 V to 2.1 V, and 2.1 V to 2.3 V.

The voltage applied to the selected word line in the read operation of C level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V.

A time (tR) of the read operation may be set within the range of, for example, 25 µs to 38 µs, 38 µs to 70 µs, or 70 µs to 80 µs.

(2) A write operation includes a program operation and a verify operation. In the write operation, the voltage first applied to the selected word line in the program operation may range from, for example, 13.7 V to 14.3 V. The voltage is not limited to this and may be set within any one of the ranges of, for example, 13.7 V to 14.0 V and 14.0 V to 14.6 V.

The voltage first applied to the selected word line when write-accessing an odd-numbered word line and the voltage first applied to the selected word line when write-accessing an even-numbered word line may be different.

If the program operation is ISPP (Incremental Step Pulse Program), the step-up voltage is, for example, 0.5 V.

The voltage applied to an unselected word line may be set within the range of, for example, 6.0 V to 7.3 V. However, the voltage is not limited to this and may be set within the range of, for example, 7.3 V to 8.4 or set to 6.0 V or less.

The pass voltage to be applied may be changed depending on whether the unselected word line is an odd-numbered word line or an even-numbered word line.

A time (tProg) of the write operation may be set within the range of, for example, 1,700 µs to 1,800 µs, 1,800 µs to 1,900 µs, or 1,900 µs to 2000 µs.

(3) In erase operation, the voltage first applied to the well which is formed in the upper portion of the semiconductor substrate and above which the memory cell is arranged is set within the range of, for example, 12 V to 13.6 V. However, the voltage is not limited to this and may be set within the range of, for example, 13.6 V to 14.8 V, 14.8 V to 19.0 V, 19.0 V to 19.8 V, or 19.8 V to 21 V.

A time (tErase) of the erase operation may be set within the range of, for example, 3,000 µs to 4,000 µs, 4,000 µs to 5,000 µs, or 4,000 µs to 9,000 µs.

(4) The structure of the memory cell may include a charge accumulation layer arranged on a 4 to 10 nm thick tunnel insulating film on the semiconductor substrate (silicon substrate). The charge accumulation layer may have a stacked structure of a 2 to 3 nm thick insulating film of SiN or SiOn and 3 to 8 nm thick polysilicon. A metal such as Ru may be doped into the polysilicon. An insulating film may be provided on the charge accumulation layer. The insulating film may include a 4 to 10 nm thick silicon oxide film sandwiched between a 3 to 10 nm thick lower High-k film and a 3 to 10 nm thick upper High-k film. As the High-k film, HfO or the like is usable. The silicon oxide film may be thicker than the High-k film. A 30 to 70 nm thick control electrode may be formed on a 3 to 10 nm thick work function adjusting material on the insulating film. Here, the work function adjusting material may be a metal oxide film such as TaO or a metal nitride film such as TaN. As the control electrode, W or the like is usable.

An air gap may be formed between the memory cells.

In the above embodiments, a NAND flash memory has been exemplified as the semiconductor memory device. However, the embodiments are applicable not only to the NAND flash memory but also other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory device including a memory cell array and a latch circuit capable of holding data read from the memory cell array; and
a controller capable of issuing a first read instruction and a second read instruction different from the first read instruction, wherein when receiving the first read instruction, the semiconductor memory device reads first data and second data from the memory cell array, holds the first data and the second data in the latch circuit, and outputs the first data to the controller, and when receiving the second read instruction, the semiconductor memory device outputs third data based on the second data held by the latch circuit to the controller, and wherein the controller performs soft decision processing using the third data.

2. The system according to claim 1, wherein the memory cell array includes a first word line and a memory cell connected to the first word line, the first data is read from the memory cell by applying a first voltage to the first word line, and the second data is read from the memory cell by applying a second voltage different from the first voltage to the first word line.

3. The system according to claim 1, wherein when receiving the first read instruction, the semiconductor memory device further reads fourth data from the memory cell array and holds the fourth data in the latch circuit, and when receiving the second read instruction, the semiconductor memory device generates the third data based on the second data and the fourth data held by the latch circuit, and wherein the first data is read from a memory cell by applying a first voltage to a first word line, the second data is read from the memory cell by applying a second voltage lower than the first voltage to the first word line, and the fourth data is read from the memory cell by applying a third voltage higher than the first voltage to the first word line.

4. The system according to claim 3, wherein the semiconductor memory device generates the third data by an XNOR operation of the second data and the fourth data.

5. The system according to claim 3, wherein an absolute value of a difference between the first voltage and the second voltage is equal to an absolute value of a difference between the first voltage and the third voltage.

6. The system according to claim 3, wherein the first voltage is based on a difference between the numbers of on-bits obtained when voltages of a plurality of values are applied to the first word line.

7. The system according to claim 3, wherein the voltage applied to the first word line temporally continuously changes.

8. The system according to claim 1, wherein the controller issues the second read instruction when hard bit decoding of the first data received from the semiconductor memory device is failed.

9. The system according to claim 1, wherein the memory cell array includes a plurality of memory cells which is three-dimensionally stacked.

10. A memory system comprising:
a semiconductor memory device including a memory cell array and a latch circuit capable of holding data read from the memory cell array; and
a controller capable of issuing a first read instruction and a second read instruction different from the first read instruction, wherein the semiconductor memory device includes:
a first word line;
a plurality of memory cells connected to the first word line;
a row decoder configured to apply a first voltage, a second voltage, and a third voltage, which are different from each other, to the first word line when the semiconductor memory device receives the first read instruction;
a first latch circuit, a second latch circuit, and a third latch circuit which are configured to hold first data, second data, and third data read from a memory cell by applying the first voltage, the second voltage, and the third voltage to the first word line, respectively; and
a processor, configured to generate fourth data based on at least the first data and the third data upon receiving the second read instruction, and wherein the controller receives the second data from the semiconductor memory device when the first read instruction is issued, and receives the fourth data from the semiconductor memory device and performs soft decision processing when the second read instruction is issued.

11. The system according to claim 10, wherein the second voltage is higher than the first voltage, and the third voltage is higher than the second voltage.

12. The system according to claim 11, wherein a difference between the second voltage and the first voltage is equal to a difference between the third voltage and the second voltage.

13. The system according to claim 10, wherein the processor generates the fourth data by an XNOR operation of the first data and the third data.

14. The system according to claim 10, wherein the first voltage is based on the number of on-bits obtained when voltages of a plurality of values are applied to the first word line.

15. The system according to claim 10, wherein the voltage applied to the first word line temporally continuously changes, and the first data, the second data, and the third data is strobed when the voltage of the first word line reaches to the first voltage, the second voltage, and the third voltage.

16. The system according to claim 10, wherein the controller issues the second read instruction when hard bit decoding of the second data received from the semiconductor memory device is failed.

17. The system according to claim 10, wherein the memory cell array includes a plurality of memory cells which is three-dimensionally stacked.

* * * * *